(12) United States Patent
Salahuddin et al.

(10) Patent No.: US 12,099,788 B2
(45) Date of Patent: Sep. 24, 2024

(54) METHOD AND SYSTEM FOR PREDICTING PERFORMANCE IN ELECTRONIC DESIGN BASED ON MACHINE LEARNING

(71) Applicant: Agency for Science, Technology and Research, Singapore (SG)

(72) Inventors: Raju Salahuddin, Singapore (SG); Rahul Dutta, Singapore (SG); Kevin Tshun Chuan Chai, Singapore (SG); Ashish James, Singapore (SG); Chuan Sheng Foo, Singapore (SG); Zeng Zeng, Singapore (SG); Savitha Ramasamy, Singapore (SG); Vijay Ramaseshan Chandrasekhar, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 792 days.

(21) Appl. No.: 17/296,169

(22) PCT Filed: Nov. 25, 2019

(86) PCT No.: PCT/SG2019/050575
§ 371 (c)(1),
(2) Date: May 21, 2021

(87) PCT Pub. No.: WO2020/112023
PCT Pub. Date: Jun. 4, 2020

(65) Prior Publication Data
US 2022/0004900 A1    Jan. 6, 2022

(30) Foreign Application Priority Data

Nov. 26, 2018  (SG) ............................ 10201810573V

(51) Int. Cl.
*G06F 30/27* (2020.01)
*G06F 30/31* (2020.01)
*G06N 20/00* (2019.01)

(52) U.S. Cl.
CPC .............. *G06F 30/27* (2020.01); *G06F 30/31* (2020.01); *G06N 20/00* (2019.01)

(58) Field of Classification Search
CPC .......... G06F 30/27; G06F 30/31; G06N 20/00
(Continued)

(56) References Cited

U.S. PATENT DOCUMENTS

| 6,857,112 B1 | 2/2005 | Teig et al. |
| 6,961,914 B1 | 11/2005 | Teig et al. |

(Continued)

FOREIGN PATENT DOCUMENTS

| CN | 104834772 A | | 8/2015 |
| CN | 113901753 A | * | 1/2022 |

(Continued)

OTHER PUBLICATIONS

International Search Report for International Application No. PCT/SG2019/050575 dated Jan. 17, 2020, pp. 1-3.

(Continued)

*Primary Examiner* — Suresh Memula
(74) *Attorney, Agent, or Firm* — Shackelford, McKinley & Norton, LLP

(57) ABSTRACT

There is provided a method of predicting performance in electronic design based on machine learning using at least one processor, the method including: providing a first machine learning model configured to predict performance data for an electronic system based on a set of input design parameters for the electronic system; providing a second machine learning model configured to generate a new set of parameter values for the set of input design parameters for (Continued)

the electronic system based on a desired performance data provided for the electronic system; generating, using the second machine learning model, the new set of parameter values for the set of input design parameters for the electronic system based on the desired performance data provided for the electronic system; evaluating the set of input design parameters having the new set of parameter values for the electronic system to obtain an evaluated performance data associated with the set of input design parameters having the new set of parameter values; generating a new set of training data based on the set of input design parameters having the new set of parameter values and the evaluated performance data associated with the set of input design parameters having the new set of parameter values; and training the first machine learning model based on at least the new set of training data. There is also provided a corresponding system for predicting performance in electronic design based on machine learning.

20 Claims, 10 Drawing Sheets

(58) Field of Classification Search
USPC .......................................................... 716/106
See application file for complete search history.

(56) References Cited

U.S. PATENT DOCUMENTS

| | | | | |
|---|---|---|---|---|
| 7,103,524 | B1* | 9/2006 | Teig | G06F 30/398 |
| | | | | 716/113 |
| 9,715,663 | B2* | 7/2017 | Baldini Soares | G06N 5/04 |
| 10,699,051 | B1* | 6/2020 | Zhang | G06F 30/392 |
| 11,087,060 | B1* | 8/2021 | Zhang | G06N 20/00 |
| 11,144,701 | B2* | 10/2021 | Egan | G06F 3/04847 |
| 11,620,548 | B1* | 4/2023 | Bhushan | G06N 20/00 |
| | | | | 706/12 |
| 11,645,440 | B1* | 5/2023 | Bustany | G06F 30/392 |
| | | | | 716/102 |
| 11,829,852 | B1* | 11/2023 | Bhushan | G06F 30/398 |
| 11,842,130 | B1* | 12/2023 | Khatun | G06F 30/367 |
| 2016/0162802 | A1 | 6/2016 | Chickering et al. | |
| 2016/0253445 | A1 | 9/2016 | Pataky | |
| 2018/0147062 | A1* | 5/2018 | Ay | A61F 2/30942 |
| 2018/0197110 | A1* | 7/2018 | Rao | G06F 30/398 |
| 2018/0268096 | A1 | 9/2018 | Chuang et al. | |
| 2018/0293721 | A1* | 10/2018 | Gupta | G06N 3/045 |
| 2020/0134367 | A1* | 4/2020 | Chopra | G06N 5/01 |
| 2020/0293940 | A1* | 9/2020 | Chopra | G06F 8/34 |
| 2022/0391566 | A1* | 12/2022 | Li | G06F 30/27 |
| 2024/0193913 | A1* | 6/2024 | Saraee | G06V 10/40 |

FOREIGN PATENT DOCUMENTS

| | | | | | |
|---|---|---|---|---|---|
| CN | 114925646 | A | * | 8/2022 | G06F 30/392 |
| CN | 115345312 | A | * | 11/2022 | |
| CN | 117634394 | A | * | 3/2024 | |
| EP | 3502920 | A1 | * | 6/2019 | G05B 23/00 |
| KR | 20210134975 | A | * | 11/2021 | |
| WO | WO-2018204193 | A1 | * | 11/2018 | G03F 1/36 |
| WO | WO-2019048506 | A1 | * | 3/2019 | G03F 1/36 |
| WO | WO-2020112023 | A1 | * | 6/2020 | G06F 30/31 |
| WO | WO-2020112025 | A1 | * | 6/2020 | G06F 30/27 |

OTHER PUBLICATIONS

Written Opinion of the International Searching Authority for International Application No. PCT/SG2019/050575 dated Jan. 17, 2020, pp. 1-5.

Malkiel et al., "Deep Learning for Design and Retrieval of Nanophotonic Structures," Optics: arXiv:1702.07949, Feb. 25, 2017, pp. 1-13.

Zhang et al., "Deep Learning Based Inverse Method for Layout Design," Signal Processing: arXiv:1806.03182, Jun. 7, 2018, pp. 1-17.

* cited by examiner

METHOD AND SYSTEM FOR PREDICTING PERFORMANCE IN ELECTRONIC DESIGN BASED ON MACHINE LEARNING

CROSS-REFERENCE TO RELATED APPLICATION

This application claims the benefit of priority of Singapore Patent Application No. 10201810573V, filed on 26 Nov. 2018, the content of which being hereby incorporated by reference in its entirety for all purposes.

TECHNICAL FIELD

The present invention generally relates to a method of predicting performance in electronic design based on machine learning, and a system thereof.

BACKGROUND

Conventionally, electronic design is done by experienced engineers (e.g., electronic circuit designer) with prior knowledge of the design. Throughout the conventional design process, the designers may manually perform a large number of iterations to achieve specified design goal(s) or performance target(s), thereby incurring significant design time and costs. In particular, a large number of simulations and verifications may be manually performed during the conventional design process. If the specification in any design cycle is not met, the designers have to redesign and verify the performance through simulation again. In some cases, the designer has to back-track from one design stage to another. The designers may prefer to complete the design sequentially, i.e., top-to-bottom. But, in practice, this may be difficult due to nonlinear and high dimensional nature of the analog design space. Thus, the whole design flow may typically be iterative in nature.

A need therefore exists to provide a method of predicting performance in electronic design based on machine learning, and a system thereof, that seek to overcome, or at least ameliorate, one or more of the deficiencies in existing or conventional methods/systems in electronic design, such as but not limited to, improving the efficiency and/or accuracy of predicting performance in electronic design. It is against this background that the present invention has been developed.

SUMMARY

According to a first aspect of the present invention, there is provided a method of predicting performance in electronic design based on machine learning using at least one processor, the method comprising:
providing a first machine learning model configured to predict performance data for an electronic system based on a set of input design parameters for the electronic system;
providing a second machine learning model configured to generate a new set of parameter values for the set of input design parameters for the electronic system based on a desired performance data provided for the electronic system;
generating, using the second machine learning model, the new set of parameter values for the set of input design parameters for the electronic system based on the desired performance data provided for the electronic system;
evaluating the set of input design parameters having the new set of parameter values for the electronic system to obtain an evaluated performance data associated with the set of input design parameters having the new set of parameter values;
generating a new set of training data based on the set of input design parameters having the new set of parameter values and the evaluated performance data associated with the set of input design parameters having the new set of parameter values; and
training the first machine learning model based on at least the new set of training data.

According to a second aspect of the present invention, there is provided a system for predicting performance in electronic design based on machine learning, the system comprising:
a memory; and
at least one processor communicatively coupled to the memory and configured to:
provide a first machine learning model configured to predict performance data for an electronic system based on a set of input design parameters for the electronic system;
provide a second machine learning model configured to generate a new set of parameter values for the set of input design parameters for the electronic system based on a desired performance data provided for the electronic system;
generate, using the second machine learning model, the new set of parameter values for the set of input design parameters for the electronic system based on the desired performance data provided for the electronic system;
evaluate the set of input design parameters having the new set of parameter values for the electronic system to obtain an evaluated performance data associated with the set of input design parameters having the new set of parameter values;
generate a new set of training data based on the set of input design parameters having the new set of parameter values and the evaluated performance data associated with the set of input design parameters having the new set of parameter values; and
train the first machine learning model based on at least the new set of training data.

According to a third aspect of the present invention, there is provided a computer program product, embodied in one or more non-transitory computer-readable storage mediums, comprising instructions executable by at least one processor to perform a method of predicting performance in electronic design based on machine learning, the method comprising:
providing a first machine learning model configured to predict performance data for an electronic system based on a set of input design parameters for the electronic system;
providing a second machine learning model configured to generate a new set of parameter values for the set of input design parameters for the electronic system based on a desired performance data provided for the electronic system;
generating, using the second machine learning model, the new set of parameter values for the set of input design parameters for the electronic system based on the desired performance data provided for the electronic system;
evaluating the set of input design parameters having the new set of parameter values for the electronic system to obtain an evaluated performance data associated with the set of input design parameters having the new set of parameter values;

generating a new set of training data based on the set of input design parameters having the new set of parameter values and the evaluated performance data associated with the new set of input design parameters having the new set of parameter values; and training the first machine learning model based on at least the new set of training data.

BRIEF DESCRIPTION OF THE DRAWINGS

Embodiments of the present invention will be better understood and readily apparent to one of ordinary skill in the art from the following written description, by way of example only, and in conjunction with the drawings, in which.

DETAILED DESCRIPTION

Various embodiments of the present invention provide a method of predicting performance in electronic design based on machine learning, and a system thereof.

Electronic design automation (EDA) (which may also be referred to as electronic computer-aided design (ECAD)) is a category of software tools for designing and verifying/analyzing electronic systems, such as integrated circuits and printed circuit boards, and is known in the art. For example, an integrated circuit may have an extremely large number of components (e.g., millions of components or more), therefore, EDA tools are necessary for their design. Over time, EDA tools evolved into interactive programs that perform, for example, integrated circuit layout. For example, various companies created equivalent layout programs for printed circuit boards. These integrated circuit and circuit board layout programs may be front-end tools for schematic capture and simulation, which may be known as Computer-Aided Design (CAD) tools and may be classified as Computer-Aided Engineering (CAE). The term "automation" may refer to the ability for end-users to augment, customize, and drive the capabilities of electronic design and verification tools using a computer program (e.g., a scripting language) and associated support utilities. There are a wide variety of programming languages available, and the most commonly used by far are traditional C and its object-oriented offspring, C++. A gate-level netlist may refer to a circuit representation at the level of individual logic gates, registers, and other simple functions. The gate-level netlist may also specify the connections (wires) between the various gates and functions. A component-level netlist may refer to a circuit representation at the level of individual components. As EDA, as well as EDA tools, are well known in the art, they need not be described in detail herein for clarity and conciseness.

Figure 1:
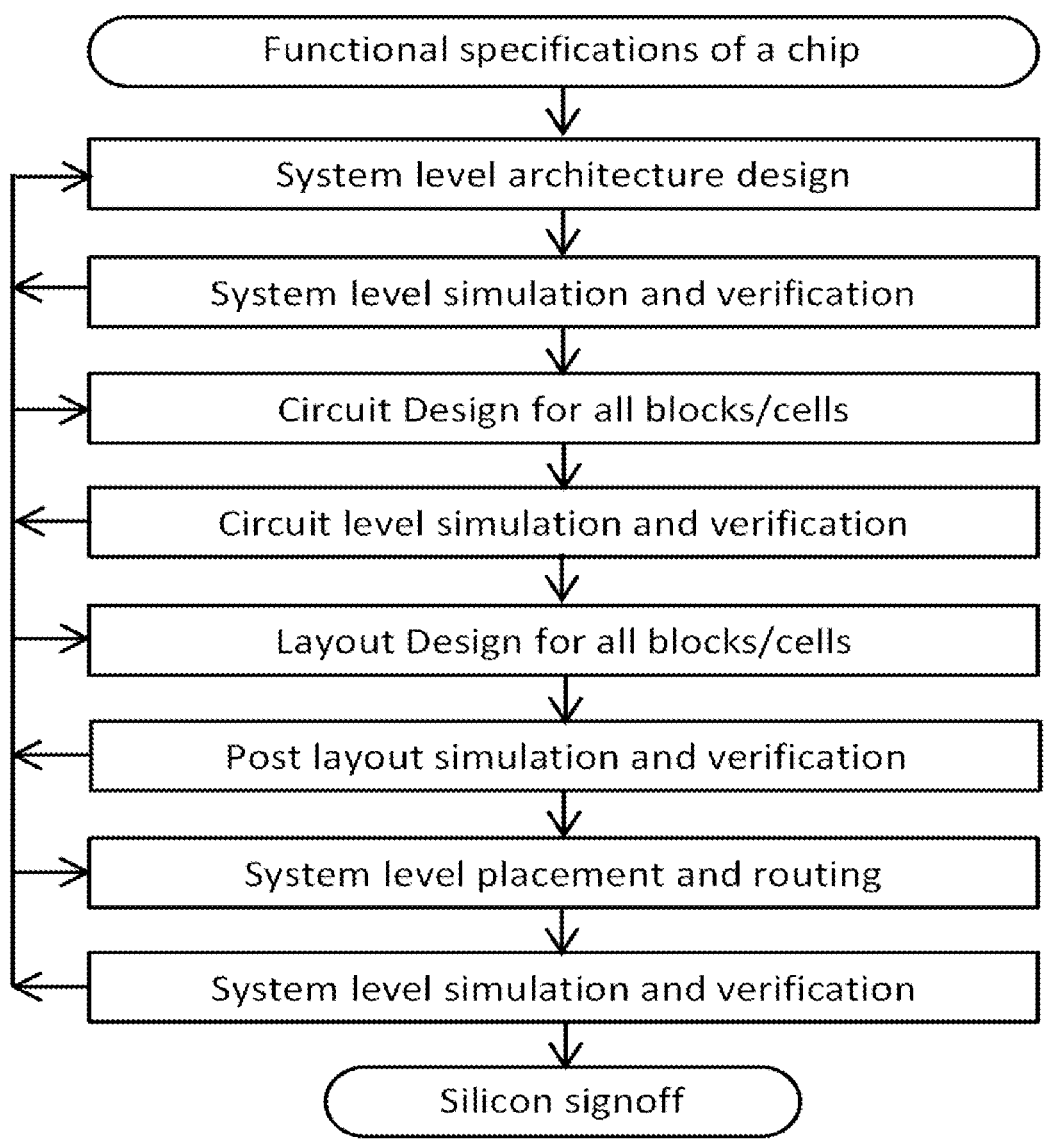
FIG. 1 depicts a flow diagram illustrating a generic chip design process.

By way of an example for illustration purpose only, FIG. 1 depicts a flow diagram illustrating a generic chip design process 100. In general, at a first stage of the design process, the specification (or functional specification) of the chip may be set. In this regard, the specification may capture the overall performance that determines the functionalities of the intended applications. The design process may start with the system level architecture followed by functional blocks/cells (or building blocks/cells) schematic with product level specification. The behaviors of these functional blocks may be specified by high-level languages, such as Verilog A and MATLAB, and simulations may be performed on the designed architecture and verified against the functional specification of the whole chip. Next, the specifications of macroblocks may be set with sufficient design margin. This design process may continue in a top-down fashion. These blocks may be implemented with the specification set in the system level. To satisfy the given specification, proper circuit topology may need to be chosen. During this process, several design constraints may apply, such as but not limited to, area and power consumption, and manufacturability issues (e.g., device matching, process corner, temperature, and so on) may be taken into consideration to ensure yield and robustness.

Since the specification of the building blocks determines the overall functionalities of the chip, in the design process, individual small block/cell design may be most important. For each unsatisfied functionality, designers may need to revisit individual blocks/cells to modify its specification and recalibrate the circuit(s). After designing the circuit(s), the behavior of the designed blocks/cells may then be verified by simulations. In the next stage, layout design may be performed by taking the sizing of the devices which are set during the schematic design. Device placement and interconnects routing may be crucial to minimize the chip area. If the area requirement is satisfied, the layout parasitics may be extracted, and then the circuit level simulation may be performed with the extracted parasitics components, which may be referred to as post-layout simulation. The post-layout simulation and verification may ensure that the performance of the blocks/cells do not diverge from the schematic level characteristics on account of the layout driven parasitics.

A final stage of the design process may include the placement and routing of individual blocks. At this final stage, several key issues may be taken into consideration, such as but not limited to, power supply routing, delay, noise, crosstalk, and substrate coupling. The system level simulation may then be completed and benchmarked against the system level specification, which was defined at the above-mentioned first stage of the design process. If the chip performance is found to be satisfied, the chip layout may then be sent to the foundry for fabricating the chip.

Accordingly, in conventional design process, a large number of simulations and verifications may be manually performed. If the specification in any design cycle is not met, the designers have to redesign and verify the performance through simulation again. In some cases, the designer has to back-track from one design stage to another. The designers may prefer to complete the design sequentially, i.e., top-to-bottom. But, in practice, this may be difficult due to non-linear and high dimensional nature of the analog design space. Thus, the whole design flow may typically be iterative in nature. Various embodiments of the present invention identified that the design process may be expedited if the prior knowledge of circuit(s) can be captured by the machine learning model and exploited (or utilized) to design the circuit(s) based on new specification. Once the machine learning model is developed, it may then be used to reduce the redesign efforts, hence expediting the chip design flow or process. In this regard, according to various embodiments of the present invention, to realize such a system, the machine learning model (or algorithms) and the EDA platform are integrated together. Accordingly, various embodiments of the present invention provide a method of predicting performance in electronic design based on machine learning, and a system thereof, that seek to overcome, or at least ameliorate, one or more of the deficiencies in existing or conventional methods/systems in electronic design, such as but not limited to, improving the efficiency and/or accuracy of predicting performance in electronic design. For example, the system according to various embodiments has been found to enable or facilitate machine learning and design optimization efficiently and seamlessly, without requiring human inputs in the loop, hence expediting the chip design cycle.

Figure 2A:
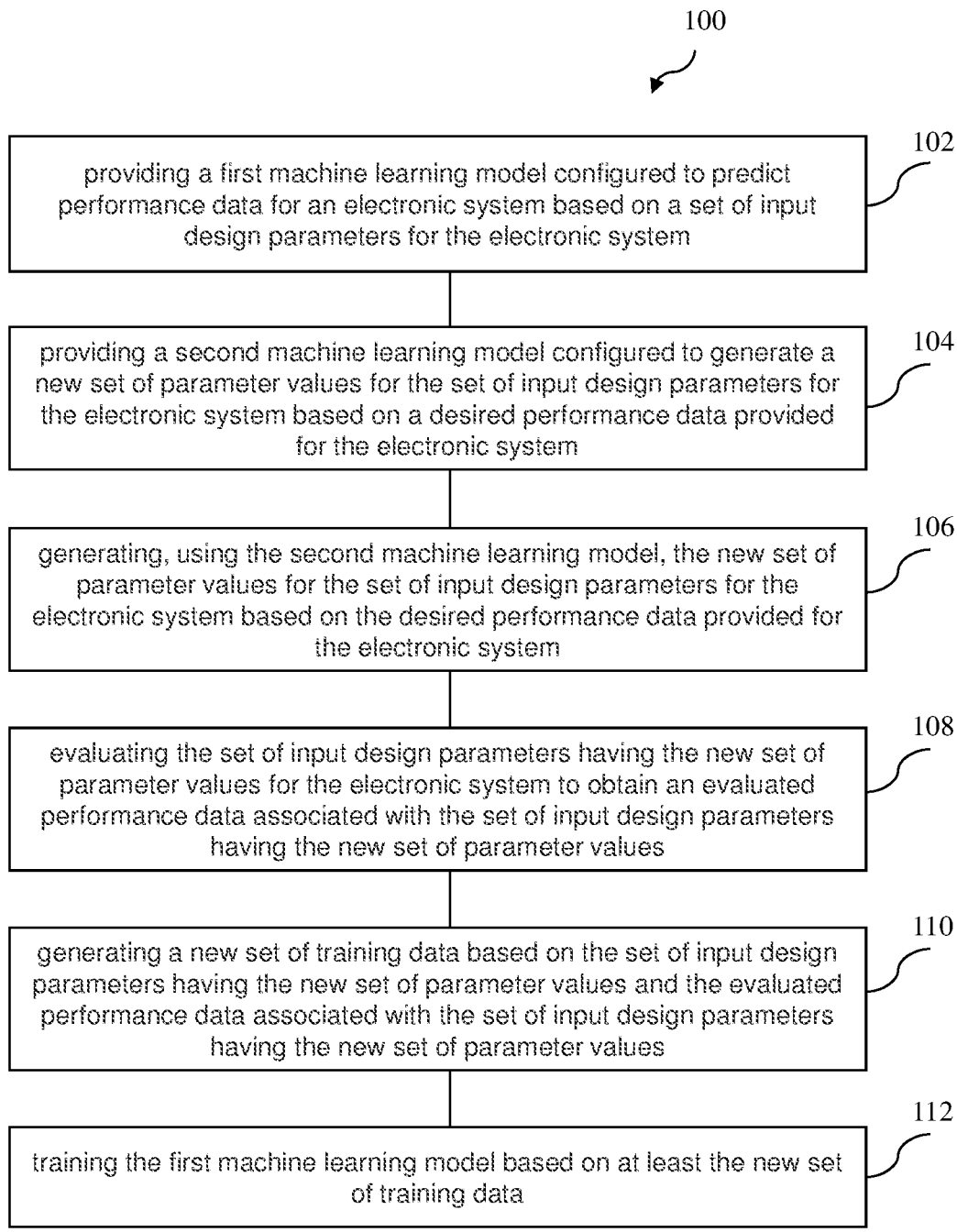
FIG. 2A depicts a flow diagram of a method of predicting performance in electronic design based on machine learning using at least one processor, according to various embodiments of the present invention.

FIG. 2A depicts a flow diagram of a method 100 of predicting performance in electronic design based on machine learning using at least one processor, according to various embodiments of the present invention. The method 100 comprises providing (at 102) a first machine learning model configured to predict performance data for an electronic system based on a set of input design parameters for the electronic system; providing (at 104) a second machine learning model configured to generate a new set of parameter values for the set of input design parameters (e.g., a parameter value for each input design parameter in the set) for the electronic system based on a desired performance data (e.g., target performance data) provided for the electronic system; generating (at 106), using the second machine learning model, the new set of parameter values for the set of input design parameters for the electronic system based on the desired performance data provided for the electronic system; evaluating (at 108) the set of input design parameters having the new set of parameter values (that is, each input design parameter in the set having a particular or specific parameter value) (e.g., may also be referred to as a new set of input design parameters) for the electronic system to obtain an evaluated performance data associated with the set of input design parameters having the new set of parameter values; generating (at 110) a new set of training data based on the set of input design parameters having the new set of parameter values and the evaluated performance data associated with the set of input design parameters having the new set of parameter values; and training (at 112) the first machine learning model based on at least the new set of training data.

In various embodiments, performance in electronic design may refer to a performance of an electronic system configured based on a set of input design parameters (e.g., having a set of parameter values, that is, each input design parameter in the set having a particular or specific parameter value) determined in an electronic design of the electronic system. In various embodiments, an electronic system may include an integrated circuit (IC) and/or a printed circuit board (PCB). In various embodiments, the performance of the electronic system may be any measurable electrical property or output of the electronic system, which may be obtained or captured as performance data, such as in the form of a set of performance parameters (e.g., performance metrics). In this regard, it will be appreciated that the performance of the electronic system to be measured or considered may be determined or set as desired or as appropriate, and the present invention is not limited to any particular performance parameters or any particular set of performance parameters.

In various embodiments, the method 100 of predicting performance in electronic design is based on machine learning. In this regard, a variety of existing EDA tools are available for verifying and/or analyzing a set of input design parameters (e.g., having a set of parameter values) for an electronic system to determine the performance of the electronic system (performance result) associated with the set of input design parameters. However, various embodiments of the present invention predict the performance of an electronic system (performance results) associated with a set of input design parameters (e.g., having a set of parameter values) based on machine learning. In particular, a machine learning model is provided for predicting the performance of an electronic system based on a set of input design parameters for the electronic system. As will be described later below according to various embodiments of the present invention, the machine learning model may be further trained (or re-trained) based on the evaluated performance of the electronic system via an EDA tool for a set of input design parameters.

In various embodiments, in relation to 102, the first machine learning model may be based on any machine learning model known in the art that is capable of being trained based on a set of training data to output a prediction based on a set of input parameters, such as but not limited to, random forest regressor, XGBoost regressor, SVMs, deep neural networks, Bayesian neural networks, and so on. In this regard, the selected machine learning model may thus be configured as a first machine learning model to predict performance data for an electronic system based on a set of input design parameters for the electronic system. In various embodiments, such a machine learning model may be referred to as a forward machine learning model herein.

In various embodiments, in relation to 104, the second machine learning model may be generated based on the first machine learning model. In particular, the second machine learning model may be configured to generate a new set of parameter values for the set of input design parameters (e.g., a parameter value for each input design parameter in the set) for the electronic system based on a desired performance data provided for the electronic system. Accordingly, the second machine learning model may be an inverse of the first machine learning model, and thus may be referred to as an inverse (or reverse) machine learning model herein. In various embodiments, the desired performance data may include a set of performance parameters (e.g., having a set of parameter values, that is, each performance parameter in the set having a particular or specific parameter value, which may also be referred to as a performance metric) desired to be achieved (e.g., performance objective(s) or target(s)) by the electronic system. In various embodiments, the new set of parameter values for the set of input design parameters may simply refer to the set of parameter values for the set of input design parameters newly generated by the second machine learning model, regardless of whether any of the parameter values for the set of input design parameters therein is the same as the parameter value(s) of the corresponding input design parameters in a set obtained in any previous iteration. In various embodiments, the set of input design parameters is predetermined or preselected, that is, the number of and the types of input design parameters in the set is predetermined or preselected.

In various embodiments, in relation to 112, training the first machine learning model may include further training (or re-training) the first machine learning model based on at least the new set of training data. In various embodiments, the first machine learning model may be further trained based on the new set of training data and one or more (e.g., all) previous sets of training data generated by the method 100 for the electronic system.

Accordingly, various embodiments of the present invention provide a method 100 of predicting performance in electronic design based on machine learning that advantageously adapts to or optimizes based on a desired performance (or target performance) of the electronic system. In this regard, in various embodiments, the machine learning model (i.e., the first machine learning model) configured to predict performance data for the electronic system is advantageously trained (e.g., further trained or re-trained iteratively) based on the desired performance of the electronic system until the desired performance (desired performance data) provided for the electronic system is deemed satisfied. Therefore, the method 100 of predicting performance in electronic design based on machine learning has been found to have improved efficiency and/or accuracy. In addition, machine learning, design and optimization can be performed and achieved seamlessly without requiring human inputs in the process.

In various embodiments, in relation to 102, the above-mentioned providing the first machine learning model comprises training the first machine learning model based on an initial set (e.g., first or original set) of training data for the electronic system. The initial set of training data may include an initial set of labeled data obtained by labeling one or more initial sets of input design parameters (e.g., a plurality of sets of input design parameters, each set having a respective set of parameter values) based on one or more corresponding evaluated performance data associated with the one or more initial sets of input design parameters. Accordingly, an initial first machine learning model may be generated by training based on the initial set of training data, from which it may then be iteratively trained in a plurality of iterations, as will be described later below.

In various embodiments, in relation to 104, the above-mentioned providing the second machine learning model comprises generating the second machine learning model based on the first machine learning model.

In various embodiments, in relation to 108, the above-mentioned evaluating the set of input design parameters having the new set of parameter values comprises evaluating the set of input design parameters having the new set of parameter values using an electronic design automation (EDA) tool. It will be appreciated by a person skilled in the art that any EDA tool(s) known in the art may be used as desired or as appropriated, such as but not limited to, Spectre, HSPICE, LTSpice, PSPICE, HFSS, ADS, AWR, Spectra AMS, Spectre RF, Assura, Calibre, Altium, CST, COMSOL, Maxwell, Icepak, SIwave, Sigrity, SI/PI Pro, and so on. It will be appreciated by a person skilled in the art that there are various EDA tool names that perform various functions in the EDA design flow, such as shown to in FIG. 4 described later below and denoted by 412. It will be appreciated that the present invention is not limited to any particular EDA tool(s).

In various embodiments, in relation to 110, the above-mentioned generating the new set of training data comprises labeling the set of input design parameters having the new set of parameter values based on the evaluated performance data to obtain a new set of labeled data, whereby the new set of training data comprising the new set of labeled data.

In various embodiments, the first machine learning model is trained iteratively in a plurality of iterations, comprising a first iteration and one or more subsequent iterations. In this regard, the first iteration comprises: the above-mentioned providing (at 104) the second machine learning model; the above-mentioned generating (at 106) the new set of parameter values for the set of input design parameters; the above-mentioned evaluating (at 108) the set of input design parameters having the new set of parameter values; the above-mentioned generating (at 110) the new set of training data; and the above-mentioned training (at 112) the first machine learning model based on at least the new set of training data. Furthermore, in each of the one or more subsequent iterations, the subsequent iteration comprises: updating the second machine learning model based on the first machine learning model trained in the immediately previous iteration to obtain an updated second machine learning model; generating, using the updated second machine learning model, a further new set of parameter values for the set of input design parameters for the electronic system based on the desired performance data provided for the electronic system; evaluating the set of input design parameters having the further new set of parameter values for the electronic system to obtain a further evaluated performance data associated with the set of input design parameters having the further new set of parameter values; generating a further new set of training data based on the set of input design parameters having the further new set of parameter values and the further evaluated performance data associated with the set of input design parameters having the further new set of parameter values; and training the first machine learning model based on at least the further new set of training data. In various embodiments, the new set of parameter values for the set of input design parameters may simply refer to the set of parameter values for the set of input design parameters newly generated by the second machine learning model, regardless of whether any of the parameter values for the set of input design parameters therein is the same as the parameter value(s) of the corresponding input design parameters in a set obtained in any previous iteration.

In various embodiments, similar that as described above with respect to 104, the further new set of parameter values for the set of input design parameters may simply refer to the set of parameter values for the set of input design parameters newly generated by the updated second machine learning model, regardless of whether any of the parameter values for the set of input design parameters therein is the same as the parameter value(s) of the corresponding input design parameters in a set obtained in any previous iteration.

In various embodiments, similar that as described above with respect to 112, the above-mentioned training the first machine learning model based on at least the further new set of training data may include further training (or re-training) the first machine learning model based on at least the further new set of training data. In various embodiments, the first machine learning model may be further trained based on the further new set of training data and one or more (e.g., all) previous sets of training data generated by the method 100 for the electronic system.

In various embodiments, the first machine learning model is trained iteratively and continues from a current iteration to a subsequent iteration of the plurality of iteration until the further new set of parameter values for the set of input design parameters obtained in the current iteration is evaluated to satisfy the desired performance data. In various embodiments, the further new set of parameter values for the set of input design parameters may be determined to satisfy the desired performance data if it is the same as or within a predefined deviation threshold of the desired performance data.

Accordingly, various embodiments of the present invention provide a method 100 of predicting performance in electronic design based on machine learning that advantageously adapts to or optimizes based on a desired performance (or target performance) of the electronic system in an iterative manner until the new set of parameter values for the set of input design parameters obtained in a current iteration is evaluated to satisfy the desired performance data for the electronic system. In particular, in each iteration, the second machine learning model is updated based on the first machine learning model which has been trained based on at least the new set of training data generated in the immediately previous iteration (the new set of training data being generated based on the set of input design parameters having a new set of parameter values (which may also be referred to as a new set of input design parameters) generated in the immediately previous iteration). As a result, the further new set of parameter values for the set of input design parameters generated by the updated second machine learning model in the current iteration may be optimized, that is, taking into account the above-mentioned new set of training data generated in the immediately previous iteration. The further new set of parameter values for the set of input design parameters generated may continue to be optimized in subsequent iterations in the same or similar manner until the further new set of parameter values for the set of input design parameters obtained is evaluated to satisfy the desired performance data for the electronic system. Therefore, the method 100 of predicting performance in electronic design based on machine learning has been found to have improved efficiency and/or accuracy. In addition, machine learning, design and optimization can be performed and achieved seamlessly without requiring human inputs in the process.

In various embodiments, the first machine learning model is a forward machine learning model (e.g., outputs predictions based on specified input parameters (i.e., input parameters having specific or particular parameter values)) and the second machine learning model is an inverse machine learning model (e.g., outputs parameter values for input design parameters based on desired outputs or performance targets).

In various embodiments, the performance data and the desired performance data each comprises a set of performance parameters (having a set of parameter values, that is, each performance parameter in the set having a particular or specific parameter value, which may also be referred to as a performance metric).

In various embodiments, the electronic system comprises at least one of an integrated circuit and a printed circuit board.

Figure 2B:
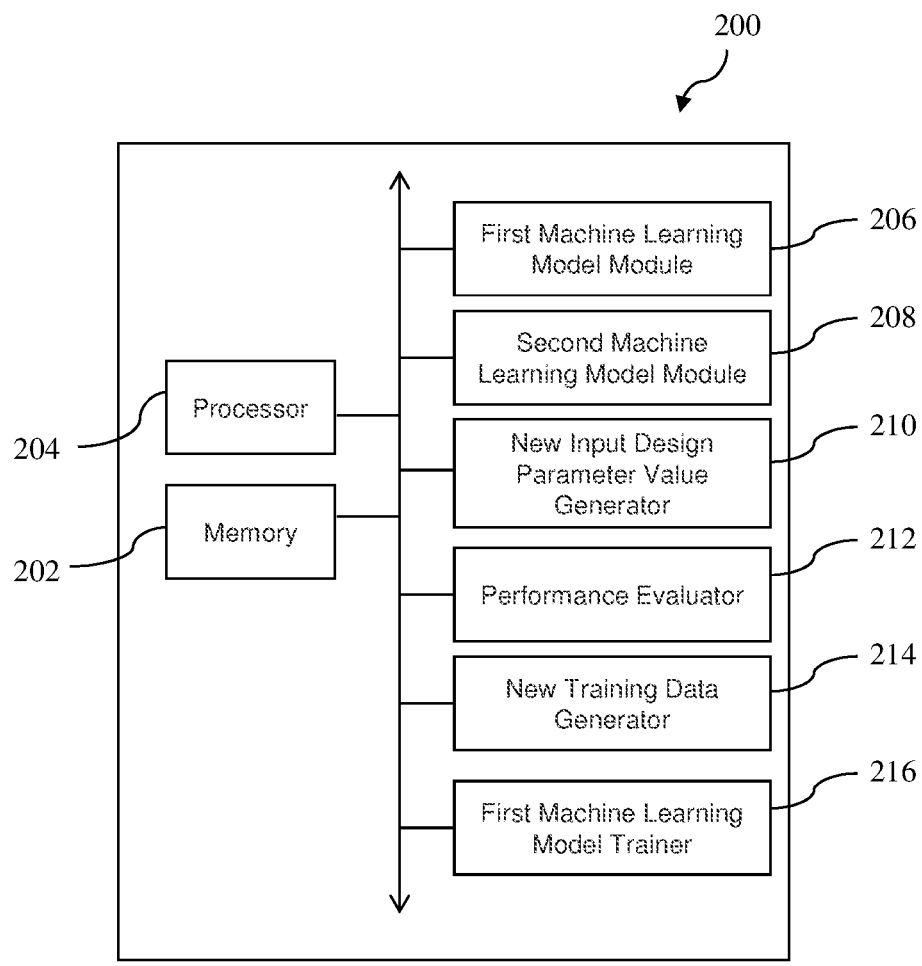
FIG. 2B depicts a schematic block diagram of a system for predicting performance in electronic design based on machine learning according to various embodiments of the present invention.

FIG. 2B depicts a schematic block diagram of a system 200 for predicting performance in electronic design based on machine learning according to various embodiments of the present invention, such as corresponding to the method 100 of predicting performance in electronic design based on machine learning as described hereinbefore according to various embodiments of the present invention. The system 200 comprises a memory 202, and at least one processor 204 communicatively coupled to the memory 202 and configured to: provide a first machine learning model configured to predict performance data for an electronic system based on a set of input design parameters for the electronic system; provide a second machine learning model configured to generate a new set of parameter values for the set of input design parameters for the electronic system based on a desired performance data provided for the electronic system; generate, using the second machine learning model, the new set of parameter values for the set of input design parameters for the electronic system based on the desired performance data provided for the electronic system; evaluate the set of input design parameters having the new set of parameter values for the electronic system to obtain an evaluated performance data associated with the set of input design parameters having the new set of parameter values; generate a new set of training data based on the set of input design parameters having the new set of parameter values and the evaluated performance data associated with the set of input design parameters having the new set of parameter values; and train the first machine learning model based on at least the new set of training data.

It will be appreciated by a person skilled in the art that the at least one processor 204 may be configured to perform the required functions or operations through set(s) of instructions (e.g., software modules) executable by the at least one processor 204 to perform the required functions or operations. Accordingly, as shown in FIG. 2B, the system 200 may comprise a first machine learning model module (or a first machine learning model circuit) 206 configured to provide a first machine learning model configured to predict performance data for an electronic system based on a set of input design parameters for the electronic system; a second machine learning model module (or a second machine learning model circuit) 208 configured to provide a second machine learning model configured to generate a new set of parameter values for the set of input design parameters for the electronic system based on a desired performance data provided for the electronic system; a new input design parameter value generator (or a new input design parameter value generating module or circuit) 210 configured to generate, using the second machine learning model, the new set of parameter values for the set of input design parameters for the electronic system based on the desired performance data provided for the electronic system; a performance evaluator (or a performance evaluating module or circuit) 212 configured to evaluate the set of input design parameters having the new set of parameter values for the electronic system to obtain an evaluated performance data associated with the set of input design parameters having the new set of parameter values; a new training data generator (or a new training data generating module or circuit) 214 configured to generate a new set of training data based on the set of input design parameters having the new set of parameter values and the evaluated performance data associated with the set of input design parameters having the new set of parameter values; and a first machine learning model trainer (or a first machine learning model training module or circuit) 216 configured to train the first machine learning model based on at least the new set of training data.

It will be appreciated by a person skilled in the art that the above-mentioned modules are not necessarily separate modules, and one or more modules may be realized by or implemented as one functional module (e.g., a circuit or a software program) as desired or as appropriate without deviating from the scope of the present invention. For example, two or more of the first machine learning model module 206, the second machine learning model module 208, the new input design parameter value generator 210, the performance evaluator 212, the new training data generator 214, and the first machine learning model trainer 216 may be realized (e.g., compiled together) as one executable software program (e.g., software application or simply referred to as an "app"), which for example may be stored in the memory 202 and executable by the at least one processor 204 to perform the functions/operations as described herein according to various embodiments.

In various embodiments, the system 200 corresponds to the method 100 as described hereinbefore with reference to FIG. 2A, therefore, various functions or operations configured to be performed by the least one processor 204 may correspond to various steps of the method 100 described hereinbefore according to various embodiments, and thus need not be repeated with respect to the system 200 for clarity and conciseness. In other words, various embodiments described herein in context of the methods are analogously valid for the respective systems, and vice versa.

For example, in various embodiments, the memory 202 may have stored therein the first machine learning model module 206, the second machine learning model module 208, the new input design parameter value generator 210, the performance evaluator 212, the new training data generator 214, and/or the first machine learning model trainer 216, which respectively correspond to various steps of the method 100 as described hereinbefore according to various embodiments, which are executable by the at least one processor 204 to perform the corresponding functions/operations as described herein.

A computing system, a controller, a microcontroller or any other system providing a processing capability may be provided according to various embodiments in the present disclosure. Such a system may be taken to include one or more processors and one or more computer-readable storage mediums. For example, the system 200 described hereinbefore may include a processor (or controller) 204 and a computer-readable storage medium (or memory) 202 which are for example used in various processing carried out therein as described herein. A memory or computer-readable storage medium used in various embodiments may be a volatile memory, for example a DRAM (Dynamic Random Access Memory) or a non-volatile memory, for example a PROM (Programmable Read Only Memory), an EPROM (Erasable PROM), EEPROM (Electrically Erasable PROM), or a flash memory, e.g., a floating gate memory, a charge trapping memory, an MRAM (Magnetoresistive Random Access Memory) or a PCRAM (Phase Change Random Access Memory).

In various embodiments, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g., a microprocessor (e.g., a Complex Instruction Set Computer (CISC) processor or a Reduced Instruction Set Computer (RISC) processor). A "circuit" may also be a processor executing software, e.g., any kind of computer program, e.g., a computer program using a virtual machine code, e.g., Java. Any other kind of implementation of the respective functions which will be described in more detail below may also be understood as a "circuit" in accordance with various alternative embodiments. Similarly, a "module" may be a portion of a system according to various embodiments in the present invention and may encompass a "circuit" as above, or may be understood to be any kind of a logic-implementing entity therefrom.

Some portions of the present disclosure are explicitly or implicitly presented in terms of algorithms and functional or symbolic representations of operations on data within a computer memory. These algorithmic descriptions and functional or symbolic representations are the means used by those skilled in the data processing arts to convey most effectively the substance of their work to others skilled in the art. An algorithm is here, and generally, conceived to be a self-consistent sequence of steps leading to a desired result. The steps are those requiring physical manipulations of physical quantities, such as electrical, magnetic or optical signals capable of being stored, transferred, combined, compared, and otherwise manipulated.

Unless specifically stated otherwise, and as apparent from the following, it will be appreciated that throughout the present specification, discussions utilizing terms such as "providing", "generating", "evaluating", "training", "updating" or the like, refer to the actions and processes of a computer system, or similar electronic device, that manipulates and transforms data represented as physical quantities within the computer system into other data similarly represented as physical quantities within the computer system or other information storage, transmission or display devices.

The present specification also discloses a system (e.g., which may also be embodied as a device or an apparatus), such as the system 200, for performing the operations/functions of the methods described herein. Such a system may be specially constructed for the required purposes, or may comprise a general purpose computer or other device selectively activated or reconfigured by a computer program stored in the computer. The algorithms presented herein are not inherently related to any particular computer or other apparatus. Various general-purpose machines may be used with computer programs in accordance with the teachings herein. Alternatively, the construction of more specialized apparatus to perform the required method steps may be appropriate.

In addition, the present specification also at least implicitly discloses a computer program or software/functional module, in that it would be apparent to the person skilled in the art that the individual steps of the methods described herein may be put into effect by computer code. The computer program is not intended to be limited to any particular programming language and implementation thereof. It will be appreciated that a variety of programming languages and coding thereof may be used to implement the teachings of the disclosure contained herein. Moreover, the computer program is not intended to be limited to any particular control flow. There are many other variants of the computer program, which can use different control flows without departing from the spirit or scope of the invention. It will be appreciated by a person skilled in the art that various modules described herein (e.g., the first machine learning model module 206, the second machine learning model module 208, the new input design parameter value generator 210, the performance evaluator 212, the new training data generator 214, and/or the first machine learning model trainer 216) may be software module(s) realized by computer program(s) or set(s) of instructions executable by a computer processor to perform the required functions, or may be hardware module(s) being functional hardware unit(s) designed to perform the required functions. It will also be appreciated that a combination of hardware and software modules may be implemented.

Furthermore, one or more of the steps of a computer program/module or method described herein may be performed in parallel rather than sequentially. Such a computer program may be stored on any computer readable medium. The computer readable medium may include storage devices such as magnetic or optical disks, memory chips, or other storage devices suitable for interfacing with a general purpose computer. The computer program when loaded and executed on such a general-purpose computer effectively results in an apparatus that implements the steps of the methods described herein.

In various embodiments, there is provided a computer program product, embodied in one or more computer-readable storage mediums (non-transitory computer-readable storage medium), comprising instructions (e.g., the first machine learning model module 206, the second machine learning model module 208, the new input design parameter value generator 210, the performance evaluator 212, the new training data generator 214, and/or the first machine learning model trainer 216) executable by one or more computer processors to perform a method 100 of predicting performance in electronic design as described hereinbefore with reference to FIG. 2A. Accordingly, various computer programs or modules described herein may be stored in a computer program product receivable by a system therein, such as the system 200 as shown in FIG. 2B, for execution by at least one processor 204 of the system 200 to perform the required or desired functions.

The software or functional modules described herein may also be implemented as hardware modules. More particularly, in the hardware sense, a module is a functional hardware unit designed for use with other components or modules. For example, a module may be implemented using discrete electronic components, or it can form a portion of an entire electronic circuit such as an Application Specific Integrated Circuit (ASIC). Numerous other possibilities exist. Those skilled in the art will appreciate that the software or functional module(s) described herein can also be implemented as a combination of hardware and software modules.

Figure 3:
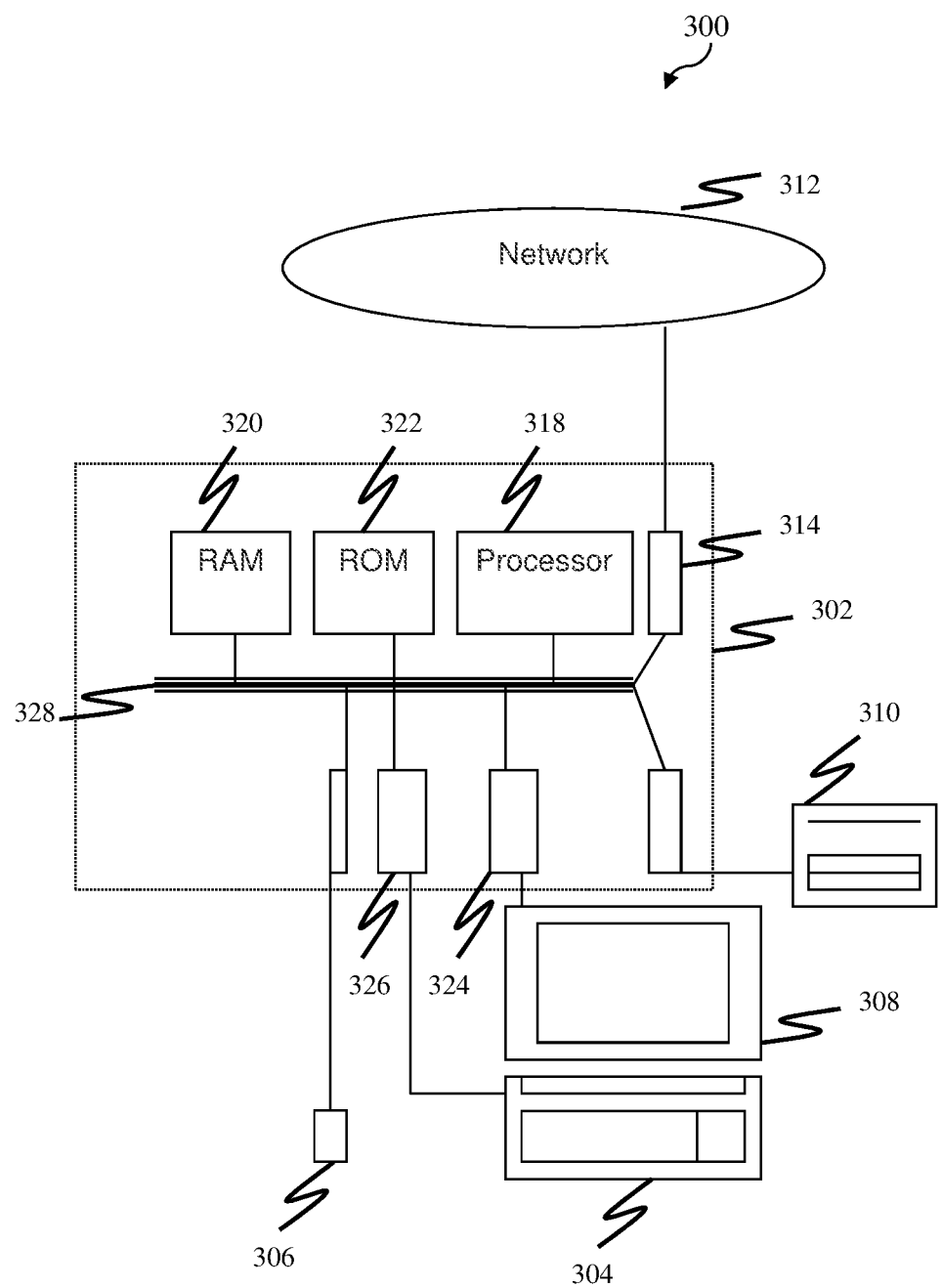
FIG. 3 depicts a schematic block diagram of an exemplary computer system in which a system for predicting performance in electronic design, according to various embodiments of the present invention, may be realized or implemented.

In various embodiments, the system 200 may be realized by any computer system (e.g., desktop or portable computer system) including at least one processor and a memory, such as a computer system 300 as schematically shown in FIG. 3 as an example only and without limitation. Various methods/steps or functional modules (e.g., the first machine learning model module 206, the second machine learning model module 208, the new input design parameter value generator 210, the performance evaluator 212, the new training data generator 214, and/or the first machine learning model trainer 216) may be implemented as software, such as a computer program being executed within the computer system 300, and instructing the computer system 300 (in particular, one or more processors therein) to conduct the methods/functions of various embodiments described herein. The computer system 300 may comprise a computer module 302, input modules, such as a keyboard 304 and a mouse 306, and a plurality of output devices such as a display 308, and a printer 310. The computer module 302 may be connected to a computer network 312 via a suitable transceiver device 314, to enable access to e.g., the Internet or other network systems such as Local Area Network (LAN) or Wide Area Network (WAN). The computer module 302 in the example may include a processor 318 for executing various instructions, a Random Access Memory (RAM) 320 and a Read Only Memory (ROM) 322. The computer module 302 may also include a number of Input/Output (I/O) interfaces, for example I/O interface 324 to the display 308, and I/O interface 326 to the keyboard 304. The components of the computer module 302 typically communicate via an interconnected bus 328 and in a manner known to the person skilled in the relevant art.

It will be appreciated by a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In order that the present invention may be readily understood and put into practical effect, various example embodiments of the present invention will be described hereinafter by way of examples only and not limitations. It will be appreciated by a person skilled in the art that the present invention may, however, be embodied in various different forms or configurations and should not be construed as limited to the example embodiments set forth hereinafter. Rather, these example embodiments are provided so that this disclosure will be thorough and complete, and will fully convey the scope of the present invention to those skilled in the art.

Various example embodiments relate to the field of electronic design through machine learning, and more specifically relate to a framework of utilizing machine learning in computer aided design (CAD) tools for design and optimization.

According to various example embodiments, there is provided a framework (method) for active machine learning for electronic design and optimization (e.g., corresponding to the method 100 of predicting performance in electronic design based on machine learning as described hereinbefore according to various embodiments). The framework may include forward and inverse machine learning models (e.g., corresponding to the first and second machine learning models, respectively, described hereinbefore according to various embodiments) tied or coupled with an EDA (e.g., including CAD) tool which functions as an output evaluator. The forward machine learning model may be trained for the approximation or prediction of outputs (e.g., corresponding to predicting performance data for an electronic system based on a set of input design parameters described hereinbefore according to various embodiments) and the inverse machine learning model may be created from the trained forward machine learning model to generate a new set of parameter values for the input design parameters (which may also be referred to as new input design parameters) based on the desired outputs (performance parameters) of an electronic system. Upon obtaining the new input design parameters (e.g., corresponding to the set of input design parameters having the new or further new set of parameter values described hereinbefore according to various embodiments) from the inverse machine learning model, the new input design parameters are evaluated by the EDA (e.g., CAD) tool. The evaluation of input design parameters by EDA tool(s) are known in the art and thus need not be described herein. Subsequently, the new input design parameters are labeled and function as new training data (e.g., corresponding to the new set or further new set of training data described hereinbefore according to various embodiments) for training (e.g., further train or re-train) the forward machine learning model. In various example embodiments, this iteration (or loop) continues until the design goal(s) or specification inputted (e.g., corresponding to the "desired performance data" described hereinbefore according to various embodiments) is met.

Accordingly, various example embodiments are directed to a framework (method) of active design and optimization through machine learning in an EDA environment. The framework can facilitate or enable the training of machine learning model (forward machine learning model) as well as generate training data (e.g., including labeled data) based on EDA tools. With each iteration, the machine learning models (the forward machine learning model as well as the inverse machine learning model generated based on the forward machine learning model) become more efficient and accurate in performing the design and optimization of an electronic system. For example, various example embodiments are applicable to industries where CAD is performed. After the framework is implemented in an EDA environment, the design and optimization process with respect to an electronic system may be expedited and improved.

Figure 4:
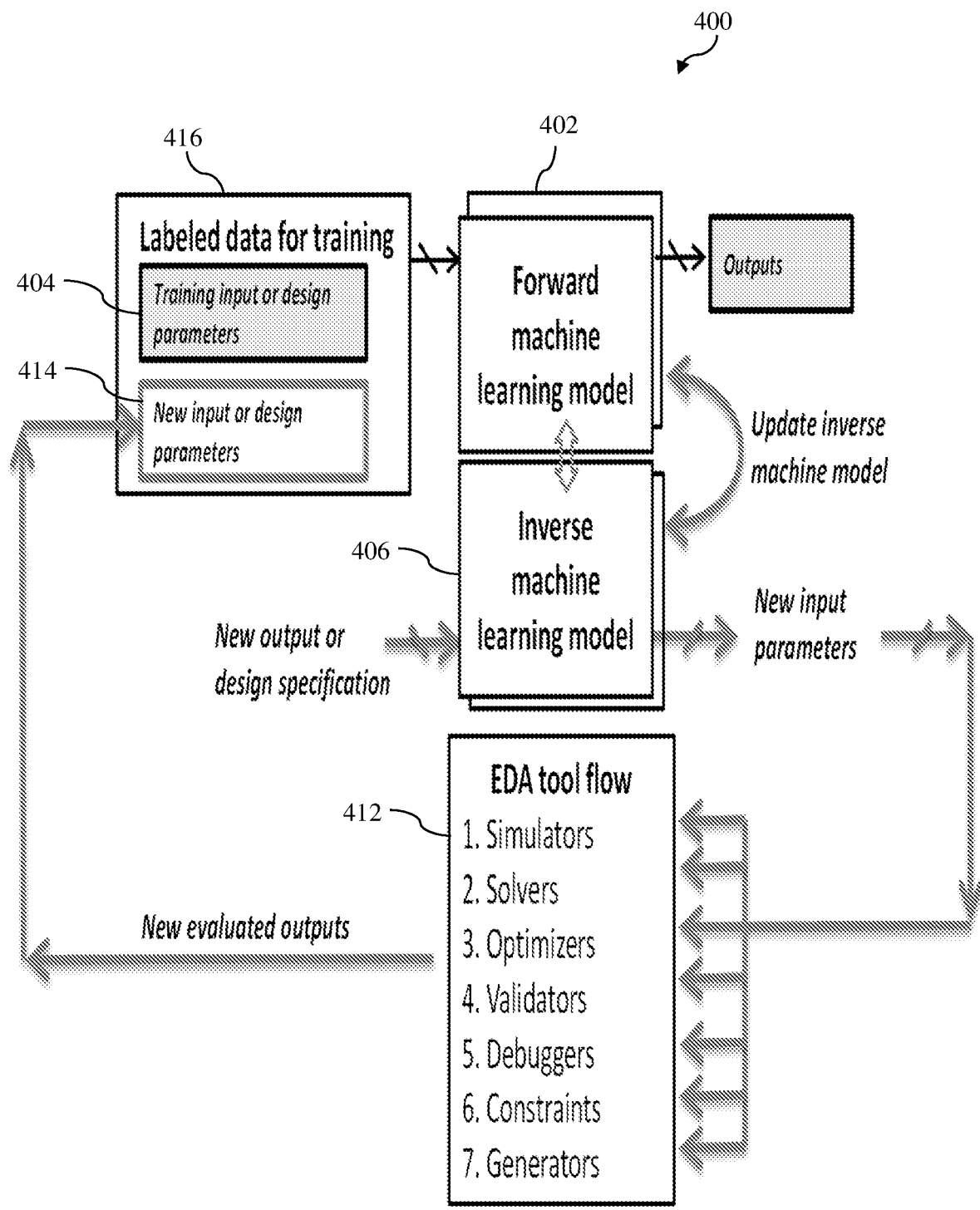
FIG. 4 depicts a schematic flow diagram of a framework (method) of active design and optimization of an electronic system through machine learning, according to various example embodiments of the present invention.

FIG. 4 depicts a schematic flow diagram of a framework (method) 400 of active design and optimization of an electronic system through machine learning (e.g., corresponding to the method 100 of predicting performance in electronic design based on machine learning as described hereinbefore according to various embodiments), according to various example embodiments of the present invention. For better understanding, the framework 400 will now be described in further detail according to various example embodiments of the present invention.

Initially (e.g., at an initial stage), a forward machine learning model 402 is trained by an initial set 404 of training data (including labeled data) to obtain an initially trained forward machine learning model 402. The initially trained forward machine learning model 402 is configured (e.g., trained based on the initial set 404 of training data) to predict performance (e.g., obtained in the form of performance data) for an electronic system based on a set of input design parameters for an electronic system. Subsequently, an inverse machine learning model 406 is generated based on (e.g., from) the forward machine learning model 402. In various example embodiments, the inverse machine learning model 406 may search for the input pattern that maximizes the forward machine learning model response for the desired output parameters (desired performance data) that have been set or received. For illustration purpose only and without limitation, in mathematical context, consider a forward model classifier that maps input points i to set of output classes c. The output neurons may encode the model class probabilities p(c|i). The optimal inverse solution may be obtained by maximizing the objective function p(c|i) that subjects to $f(X_C; \theta) - \hat{Y}_C = 0$, where $f(X_C; \theta)$ is predicted by the forward machine learning model, $X_C$ refers to the set of input design parameters and $\theta$ refers to learning parameters. $\hat{Y}_C$ is the set of desired output performance parameters. After the optimization process, the inverse machine learning model 406 proposes or generates a new set of parameter values for the set of input design parameters (which may also be referred to as a new set of input design parameters) that is able to achieve the desired output parameters. Accordingly, a forward machine learning model may refer to a machine learning model that predicts outputs for specified input parameters (i.e., input parameters having specific or particular parameter values), and an inverse machine learning model may refer to a machine learning model that outputs parameter values for input design parameters based on desired output parameters (e.g., generates or suggests parameter values for input design parameters for an electronic system in view of (e.g., seeking to achieve) desired performance outputs).

After the inverse machine learning model 406 is obtained, the inverse machine learning model 406 may generate (e.g., propose or suggest) a new set of input parameters (e.g., a new set of parameter values for the set of input design parameters) for the electronic system that seeks to satisfy the design goal(s) or target(s) inputted to or received in the inverse machine learning model 406. Subsequently, the new set of input parameters output from the inverse machine learning model 406 is inputted into an EDA tool 412 to evaluate the new set of input design parameters for the electronic system to obtain an evaluated performance data associated with the new set of input design parameters. In this regard, the evaluated performance data may include a set of performance parameters (e.g., having a set of parameter values, that is, each performance parameter in the set having a particular or specific parameter value, which may also be referred to as a performance metric) produced by the EDA tool 412 with respect to the new set of input parameters received. In various example embodiments, the EDA tool 412 may be made up of specific EDA tools or in tandem EDA tools together (e.g., simulators, solvers, optimizers, validators, debuggers, constraint generators, and/or schematic and layout artwork generators). In various example embodiments, it may then be determined whether the evaluated performance data associated with the new set of input design parameters satisfies the desired performance data (e.g., the same as or within a predefined deviation threshold). In other words, it may be evaluated whether the new set of input design parameters can result in the electronic system producing the desired output (i.e., desired performance data) or within a predefined deviation threshold. If it is determined that the evaluated performance data satisfies the desired performance data, then the design process may stop or finish (e.g., the iterative training of the forward machine learning model is stopped, that is, does not continue to another iteration and the design process finishes). On the other hand, if it is determined that the evaluated performance data associated with the new set of input design parameters does not satisfy the desired performance data (e.g., not the same as or not within a predefined deviation threshold), the design process may continue to refine or optimize the input design parameters in a next iteration with respect to the desired performance data. In this regard, the new set of input design parameters may be labeled with the evaluated outputs (evaluated performance data) from the EDA tool 412 to produce a new set of training data 414 and the new set of training data 414 may then be fed into a training data database 416 for training the forward machine learning model 402 with respect to the electronic system. Accordingly, at this stage, the training data database 416 may include the initial set of training data 404 and the new set of training data 414. Based on the updated training data database 416, the forward machine learning model 402 may be further trained or re-trained, and the inverse machine learning model 406 may then be updated based on the forward machine learning 402 model further trained as described above (i.e., in the immediately previous iteration) to obtain an updated second machine learning model 406. With each iteration, the machine learning models thus become more efficient and learn the behavior or property of the electronic system to be designed, for achieving design goals set for the electronic system.

As an example illustration for better understanding and without limitation, an example method of predicting performance (e.g., active machine learning platform) will now be described with respect to the electronic system being an integrated circuit. In various example embodiments, the input space X for a given electronic design, $\mathbb{C}$, may be controlled by n number of input design parameters (e.g., design features), where $X_C=[x_1\ x_2\ x_3\ \ldots\ x_n]^T$. For example, input design parameters provided may relate to design sizing and bias point. By way of examples only and without limitation, types of input design parameters may include length, widths, number of fingers, bias current, bias voltage, temperature, process corners, frequency, thickness, diameter, PCB trace width, PCB trace length, and so on. The output space may be defined by Y for a given $\mathbb{C}$ and may be represented by m number of performance parameters (e.g., performance metrics), where $Y_C=[y_1\ y_2\ y_3\ \ldots\ y_m]^T$. By way of an example only and without limitation, three example input design parameters with respect to the integrated circuit may be a gain parameter, a noise parameter, and a power parameter. It will be appreciated by a person skilled in the art that different chip designs may have different performance parameters. In particular, it will be appreciated by a person skilled in the art that for different chips, there may be different types of design goals or performance parameters desired to be achieved. By way of example only and without limitation, example performance parameters may include power consumption, chip bandwidth, chip area, noise voltage/current gain, power supply rejection ratio, clock speed, dynamic range, common mode rejection ratio, delay, PCB board area, data rate, and so on. By way of examples only and without limitation, the forward machine learning model may be a deep neural network (DNN), and thus, the inverse machine learning model generated based on the forward machine learning model may also be a DNN. After training the feedforward DNN (DNN regressor), the feedforward is able to map (e.g., predict) the performance of the circuit for given input design parameters, for example, by a function $Y_C=f(X_C;\theta)$, where learning parameters are represented by $\theta$. Accordingly, using the feedforward DNN, the performance of the circuit may be mapped by the function $Y_C=f(X_C;\theta)$. In addition, for the electronic design according to various example embodiments, an inverse DNN is generated from the feedforward DNN such that information can travel in the reverse direction in order to suggest or generate input design parameters $\tilde{X}_C$ for a desired circuit performance $\tilde{Y}_C$.

Figures 5A, 5B:
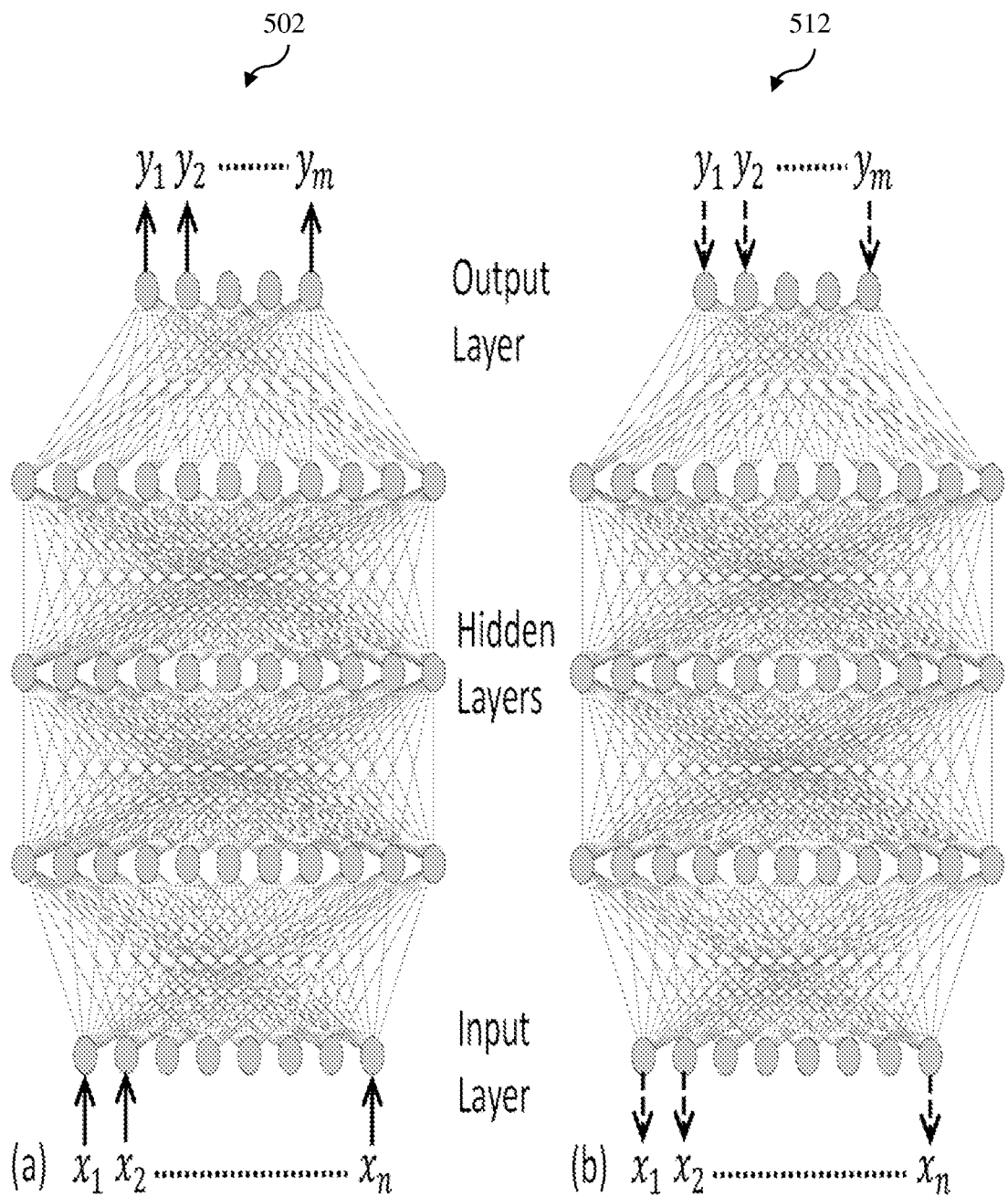
FIGS. 5A and 5B illustrate an example feedforward deep neural network (DNN) and an example inverse DNN, respectively, according to various example embodiments of the present invention.

By way of an example, FIGS. 5A and 5B illustrate an example feedforward DNN 502 and an example inverse DNN 512, respectively, according to various example embodiments of the present invention. In particular, FIG. 5A illustrates a feedforward DNN 502 including an input layer, a plurality of hidden layers, and an output layer. As shown in FIG. 5A, in the feedforward DNN 502, the predicted outputs (predicted performance data) $Y_C$ is mapped for a given set of inputs (input design parameters) $X_C$. FIG. 5B illustrates an inverse DNN 512 also including an input layer, a plurality of hidden layers, and an output layer, however, the information/data flow is reversed, whereby the output layer receives the desired performance data $\tilde{Y}_C$ as inputs and the input layer outputs the proposed new set of input design parameters (e.g., a new set of parameter values for the set of input design parameters) $\tilde{X}_C$ based on the desired performance data. Accordingly, as shown in FIG. 5B, in the inverse DNN 512, the new set of input design parameters $\tilde{X}_C$ is estimated for a desired performance data $\tilde{Y}_C$. It can be seen that information travels in an opposite direction in the inverse DNN compared to that of feedforward DNN.

Figure 6:
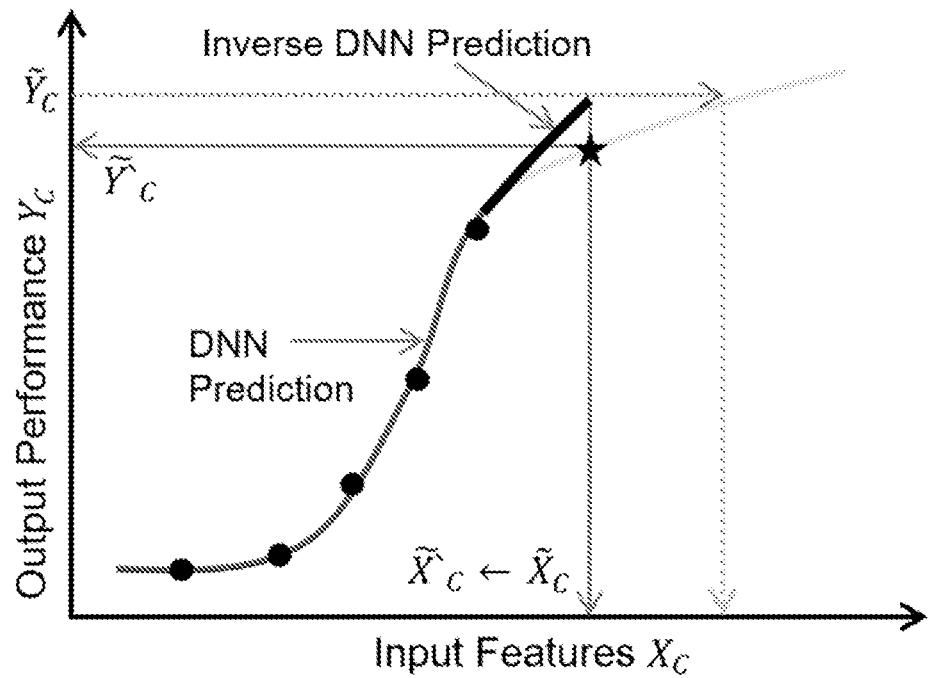
FIG. 6 depicts a conceptual mathematical interpretation of the iteration procedure in the method of predicting performance, according to various example embodiments of the present invention.

For illustration purpose and for better understanding, a conceptual mathematical interpretation of the iteration procedure in the method of predicting performance (e.g., active machine learning) is shown in FIG. 6, according to various example embodiments of the present invention. In FIG. 6, it is assumed that the feedforward DNN is trained using an initial training dataset shown as dots in FIG. 6, and the corresponding feedforward DNN predictions are shown as a solid line. After receiving a design request $\tilde{Y}_C$ (e.g., corresponding to the "desired performance data" described hereinbefore according to various embodiments), the inverse DNN proceeds to generate a new set of input design parameters $\tilde{X}_C$. This new set of input design parameters may then be transferred to an EDA tool (or EDA solver), $\tilde{X}^\ast_C \leftarrow \tilde{X}_C$, for verification. The EDA tool may then evaluate the new set of input design parameters and output an evaluated performance data $\tilde{Y}^\ast_C$ (e.g., including a set of performance parameters). A new set of training data may then be obtained based on the new set of input design parameters and the evaluated performance data associated with the new set of input design parameters, which may be represented as $\{\tilde{X}^\ast_C, \tilde{Y}^\ast_C\}$ and is indicated as a star dot in FIG. 6, and added to the training data database for training (e.g., re-training) the feedforward machine learning model. After each iteration, the feedforward DNN regressor becomes more mature, and eventually the inverse DNN can predict the necessary input design parameters (e.g., parameter values for the input design parameters) for achieving the desired output performance $\tilde{Y}_C$, for the integrated circuit.

To demonstrate the efficacy of the method of predicting performance in electronic design according to various example embodiments, the method (e.g., active machine learning platform) was implemented and an electronic design was performed. In various example embodiments, the implementation of the active machine learning platform is based on Google's TensorFlow, and a commercially available EDA tool, such as provided by Cadence, is integrated with the TensorFlow so that that the iterations process can be done seamlessly without any external assistance. The initial set of training data may be generated either by sampling technique or with the help of designers. In either case, in various example embodiments, the range of design parameters (or design features) may be defined, i.e., $X_C^{min} \leq X_C \leq X_C^{max}$. As an example, if the length of a transistor is considered as an input parameters, in the design, it may have an upper and lower bound because the transistor length cannot be so small (e.g., less than 1 nm) that it cannot be manufactured, and on the other hand, it cannot be so large it occupies centimeter size area. Accordingly, the above-mentioned bounds in the range of input design parameters may be introduced to keep the machine learning model within practical limits (e.g., practically realizable). By way of an example only and without limitation, for 55 nm technology, the minimum length may be 55 nm and the maximum length may be 5 um, and the minimum number of fingers may be 1 and the maximum number of fingers may be 1000. It will be appreciated that the bounds may vary or may be determined depending on the type of input design parameter. These bounds may also be provided by the manufacturing entities. Accordingly, the bounds may function to facilitate or ensure that the machine learning model find input design parameters (e.g., parameter values for the input design parameters) that are within the manufacturing limit. At an initial stage, the feedforward machine learning model may be initially trained based on an initial set of training data to predict the multi-variate behavior of the circuit. Subsequently, the inverse machine learning model may be used for synthesizing the circuit for a new design goal or performance target (e.g., corresponding to the "desired performance data" described hereinbefore according to various embodiments).

Figure 7:
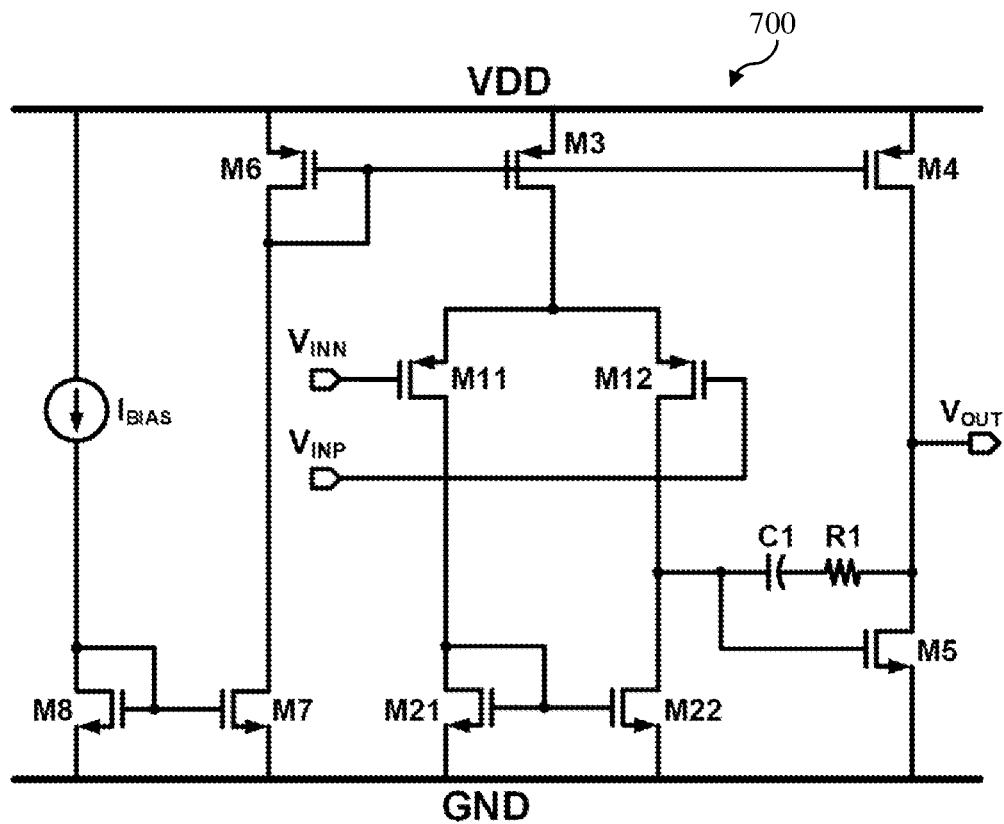
FIG. 7 depicts an example circuit schematic of a two-stage operational amplifier design in a 55 nm CMOS process, for which the method according to various example embodiment is performed to predict performance of the circuit.

By way of an example only and without limitation, FIG. 7 illustrates an example circuit schematic 700 of a two-stage operational amplifier design in a 55 nm CMOS process, for which the method according to various example embodiment is performed to predict performance of the circuit 700. In the example, 13 types of input design parameters were dedicated for device sizing and setting up the current bias, and the performance parameters (performance metrics) for the circuit 700 were defined by Gain, Bandwidth (BW), Phase Margin (PM), Slew Rate (SR), and Power Supply Rejection Ratio (PSRR). All these performance metrics were predicted using the feedforward DNN regressor. After gaining confidence on the DNN regressor, the active learning platform was used to design a two-stage amplifier with the following design goals:

$\tilde{Y}_C \in \{$Gain≥45 dB, BW≥1 MHz, PM≥50, SR≥35 M, PSRR≥60 dB$\}$

Figure 8:
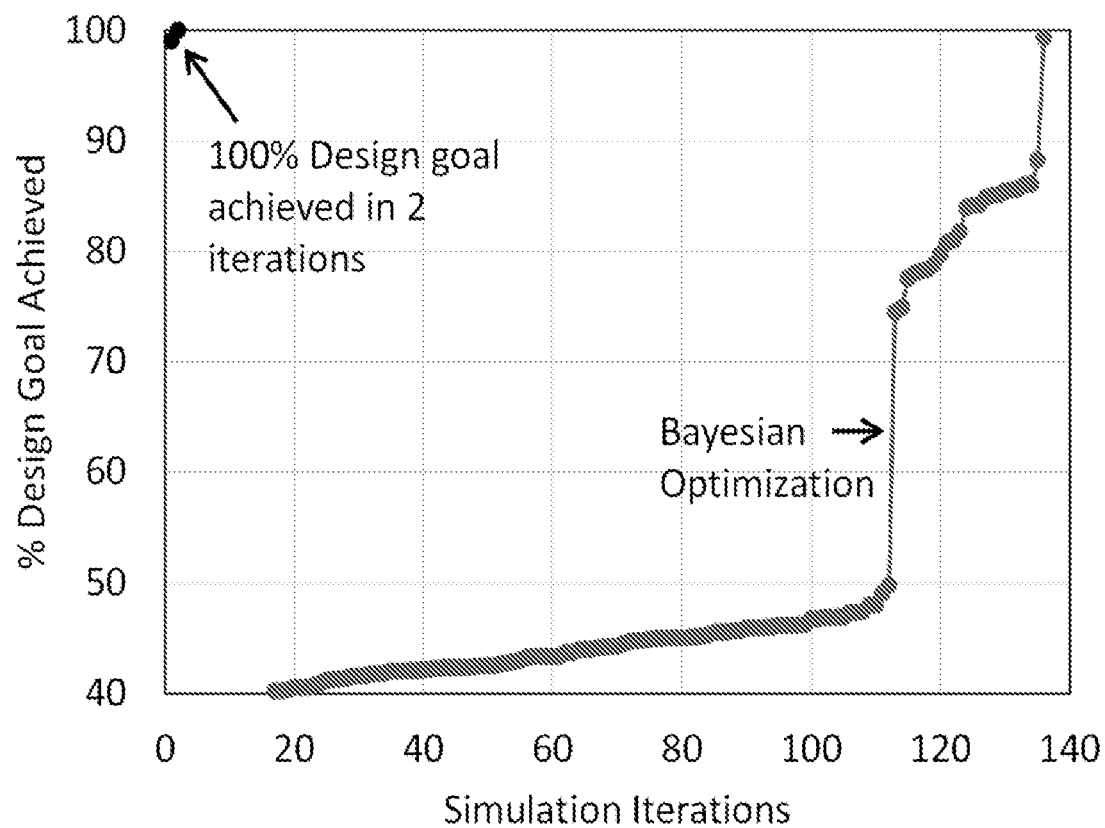
FIG. 8 illustrates the improved efficiency associated with the method of predicting performance according to various example embodiments, by comparing design and optimization time (in terms of the number of iterations) against a conventional technique, namely, the Bayesian optimization method.

The simulation time (in terms of the number of iterations) to achieve the above design goals for the above example is shown in FIG. 8. In particular, FIG. 8 illustrates the improved efficiency associated with the method of predicting performance according to various example embodiments, by comparing design and optimization time (in terms of the number of iterations) against a conventional technique, namely, the Bayesian optimization method. As shown in FIG. 8, for the above example, the desired targets or specifications are achieved in two iterations utilizing the method of predicting performance (e.g., active design and optimization framework) according to various example embodiments. The significantly fewer number iterations directly translate into significant reduction in the simulation time and EDA tool usage. The method of predicting performance according to various example embodiments may be more than 60 times faster compared to the conventional technique.

Figure 9:
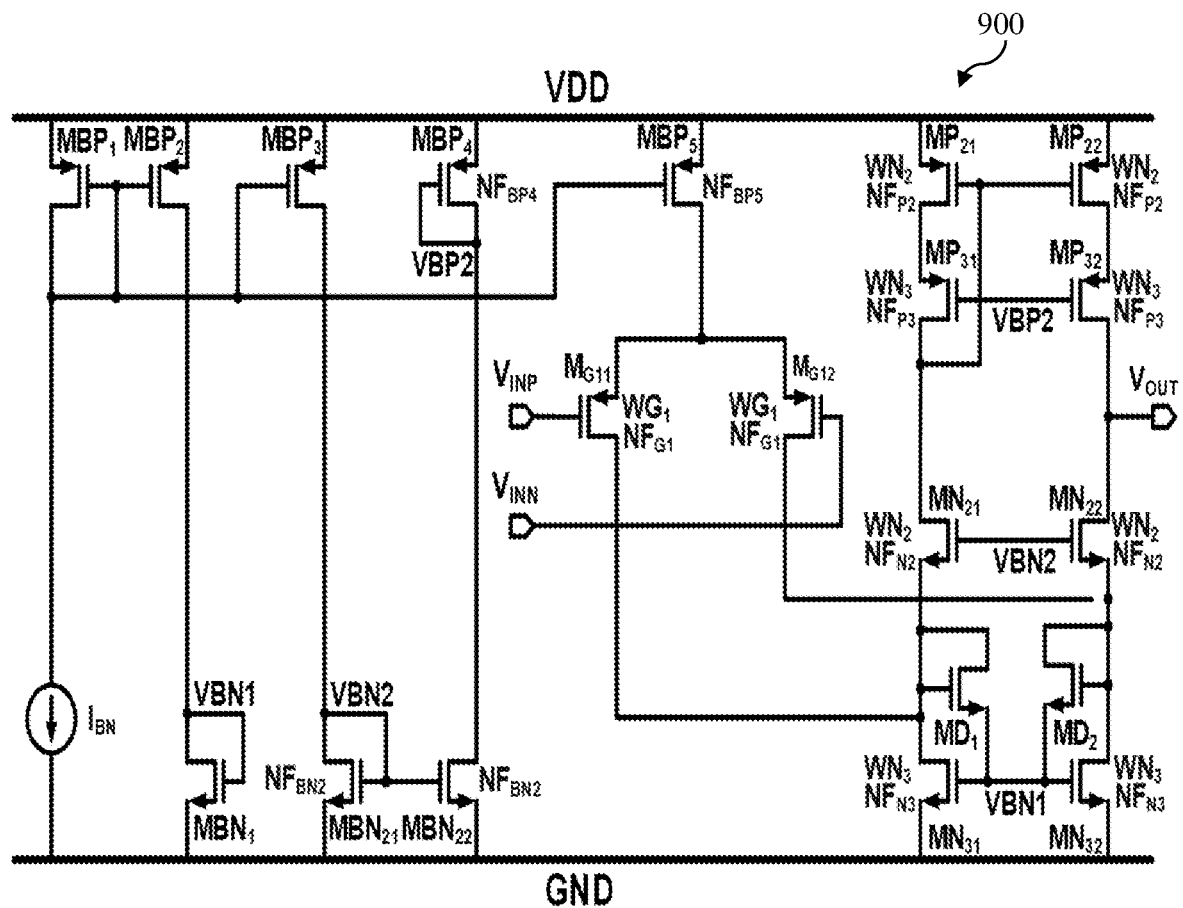
FIG. 9 depicts a schematic diagram of an example folded cascade operational amplifier, for which the method according to various example embodiment is performed to predict performance of the circuit.
Figure 10:
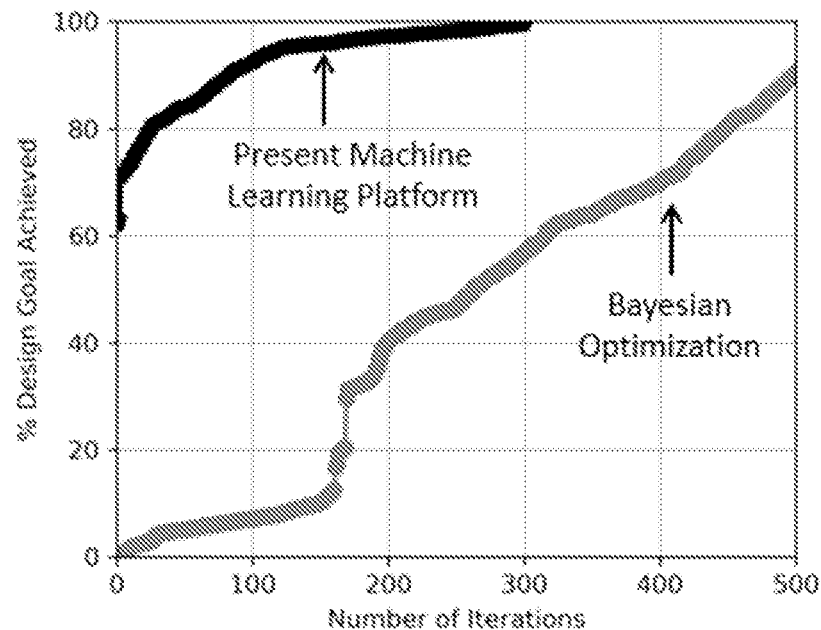
FIG. 10 depicts simulation iterations for the design closure of the example folded cascade operational amplifier, using the present machine learning platform utilizing the method of predicting performance according to various example embodiments, compared against the Bayesian optimization method.

A schematic diagram of an example folded cascade operational amplifier 900 is shown in FIG. 9. In this example, 13 types of input design parameters, i.e., $X_C \in R^{13}$, are used for device sizing and current biasing. The performance metric of this circuit is defined by Gain Bandwidth Product (GPWP), PM, SR, Input Common-Mode Range (ICMR) voltage, PSSR, CMMR, Noise and Power, i.e., $Y_C \in R^8$. Accordingly, more number of design parameters and performance parameters (performance specifications) are used in this example compared to the example two-stage operational amplifier 700 of FIG. 8. After training the DNN regressor, a new design goal $\tilde{Y}_C$ may be set for the folded cascade operational amplifier, where $\tilde{Y}_C \in \{$GBWP≥150 MHz, PM≥45°, SR≥45 V/μs, PSRR≥60 dB, CMRR≥80 dB, ICMR≥1.9 V, Noise@1 KHz≤0.15 μV/√Hz, and Power≤300 μW$\}$. In this example, three outputs, GBWP, Noise, and SR, requirement were set aggressively compared to other design goals. The machine learning platform utilizing the method of predicting performance according to various example embodiments performed 302 iterations for this design closure (i.e., to achieve the desired targets or specifications), as shown in FIG. 10. The efficacy of the machine learning platform is also compared with the Bayesian optimization method, which was found to only be able to close 95% of the design goal even after 500 iterations.

Figure 11:
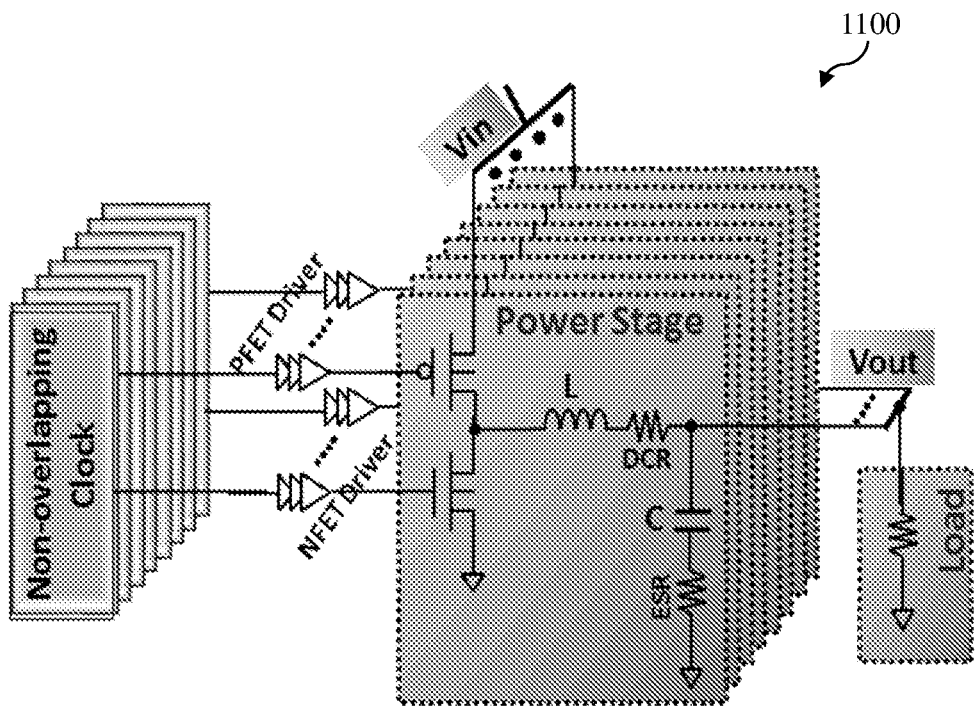
FIG. 11 depicts a schematic diagram of an example DC-DC converter.
Figure 12:
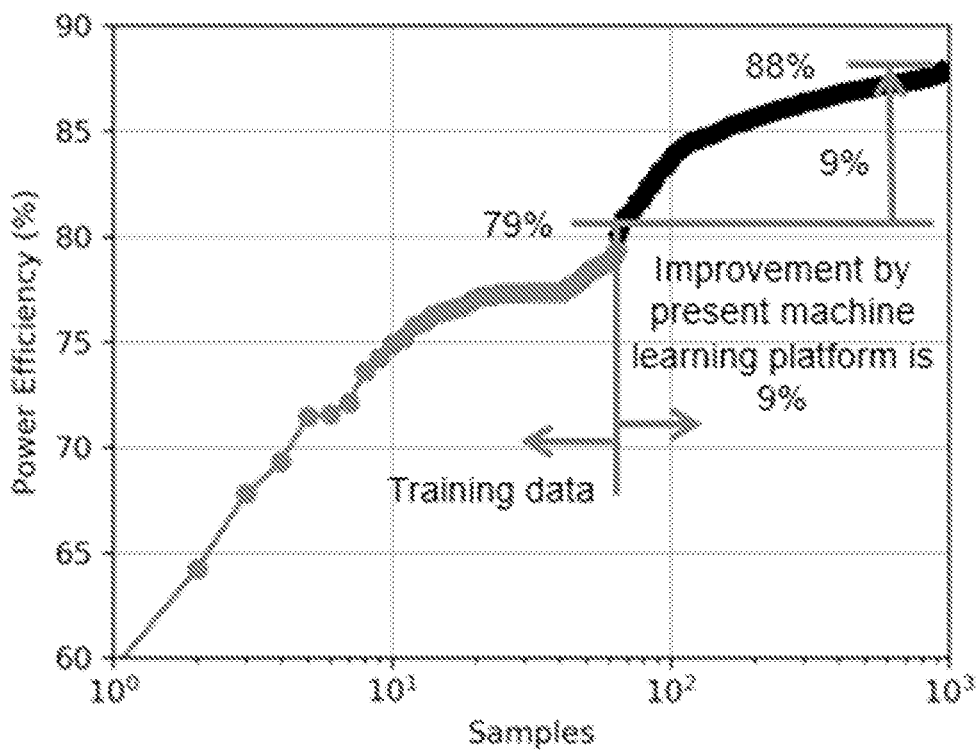
FIG. 12 depicts a graph illustrating the maximization of the efficiency of the example DC-DC converter shown in FIG. 11 using the machine learning platform according to various example embodiments of the present invention.

In various example embodiments, the machine learning platform may also be used to maximize certain performance metric of a circuit design. As an example, in DC-DC conversion, maximizing the power conversion efficiency may be the most crucial design aspect of the circuit. A schematic diagram of an example DC-DC converter 1100 is shown in FIG. 11. The efficiency of the example DC-DC converter depends on many factors, and may include the length and width of switching transistors, switching frequency, input voltage, output voltage, available inductor, and the number of phases. To test the capability of the machine learning platform according to various example embodiments for performance enhancement, at first, 65 training samples reporting maximum efficiency 79% were gathered from a workbench of a human designer. Subsequently, the feedforward DNN was trained and the machine learning platform was invoked to perform design optimization. The maximization of efficiency was performed in an iterative manner. In each successive iteration, the design goal was set higher than the previous one, i.e., $\tilde{Y}_C^{i+1} > \tilde{Y}_C^i$. FIG. 12 shows the maximization of the efficiency of the example DC-DC converter using the machine learning platform according to various example embodiments. As can be seen in FIG. 12, the efficiency substantially plateaued after 1000 iterations and the maximum efficiency achieved by the machine learning platform according to various example embodiments was about 88%, which was 9% better than that in training samples.

Accordingly, the method of predicting performance (e.g., active learning platform) according to various example embodiments advantageously integrates the feedforward and inverse DNN machine learning models (which together may be referred to as a machine learning module) along with (the help of) an EDA tool to generate the new training data to complete the training of the machine learning module for predicting the performance of an electronic system, so that the machine learning module can learn the behavior of the electronic system and can perform the design and optimization of the electronic based on desired performance in a more efficient manner. In particular, with each iteration as appropriate, the machine learning module matures (e.g., progressively updated for achieving desired performance) and performs design and optimization with improved accuracy and efficiency. Therefore, the method of predicting performance according to various example embodiments are applicable to EDA, such as where CAD is performed. In addition, the method of predicting performance according to various example embodiments advantageously help in expediting the design process and achieving superior design specifications, with greatly reduced design and optimization time in CAD environment. The method also facilitates in achieving design goal(s) at six-sigma quality level.

The following examples pertain to further example embodiments of the present invention.

Example 1 is a framework for active machine learning for electronic design comprising a forward and inverse machine learning model coupled with the EDA (e.g., including CAD) tools. The initial forward machine learning model may be initially trained with an initial predefined set of training data. The inverse machine learning model may be generated in accordance to the forward machine learning model. New input design parameters may be generated by the inverse machine learning model. The performance outputs associated with the new input design parameters may be evaluated by the EDA tools, new labeled data may be generated (based on the new input design parameters and the performance outputs) keeping the EDA tools in the loop. After generating the labeled data, the forward machine learning model may be re-trained and the inverse machine learning model may be updated in an iteration. The updated inverse machine learning model may then determine further new input design parameters in the iteration. In various example embodiments, the active machine learning may continue until the design goal or specification is achieved, without requiring human inputs in the loop.

In example 2, the subject matter of example 1 may include that one or more new training data is generated for re-training the forward machine learning model. In this regard, for training machine learning models, improved accuracy may be achieved by increasing the number of training samples. In this context, additional training samples generated by the inverse machine learning model verified through simulations may be added as additional training samples for improving the performance of the forward machine learning model.

In example 3, the subject matter of example 1 may include that there is no initial set of training data provided for training the forward machine learning model, and data labeling and training is performed while keeping the EDA tools in the loop. In this example framework (or method), the EDA tools may be kept in the loop which enable initialization of the framework without any training samples. In this case, the samples generated by the inverse machine learning model after verification through the EDA tools may be used to increase the number of training samples, which has been found to enhance the performance of the forward machine learning model.

In example 4, the subject matter of any one of examples 1 to 3 may include that the inverse machine learning model is coupled with re-enforcement learning. This example framework (or method) may be modelled as a re-enforcement learning, where the inverse neural network acts as an agent for proposing new values to the EDA optimization tools and where post optimization reward and design state (e.g., stability, convergence to output targets, and so on) are communicated back to the agent in an iterative simulation based optimization to select the next iteration of proposal.

In example 5, the subject matter of any one of examples 1 to 3 may include that the machine learning models may be re-defined and re-trained. In this regard, re-defined may refer to changing the architecture of the machine learning model. By way of an example only and without limitation, if the machine learning model is 10 layer deep initially, re-defining may, with the availability of additional data through the inverse machine learning model, realize a more complex machine learning architecture, for example, 20 layer deep model. In this regard, as the machine learning model has been changed or re-defined, the machine learning model may be re-trained with the additional number of training samples generated through this example framework.

In example 6, the subject matter of any one of examples 1 to 5 may include that the statistical variations upon manufacturing and operating conditions may be taken into account as inputs to improve the design goal at six-sigma quality level. This example may be dedicated to the yield improvement of the electronic design. For example, the statistical variation may be taken as the performance parameters or design goal, and optimize the input parameters so that the electronic design can meet the six-sigma quality level.

In example 7, the subject matter of any one of examples 1 to 6 may include that the inverse machine learning model is configured to directly be initialized or obtain constraints from within EDA simulator (simulation) database, using data-base level query and update API's. In this example, inverse machine learning model may directly work with EDA optimization algorithm in an iterative loop, whereby the inverse machine learning model may suggest new values to the input parameters which are directly (numerically) used to calculate the node current and voltages and state of the simulation Newton Raphson/Jacobian matrix to be solved in order to tightly couple for a faster convergence.

In example 8, the subject matter of any one of examples 1 to 7 may include that the inverse machine learning model is configured to directly alter design schematic using low level design creation or design database API's. In this example, inverse machine learning model may directly alter schematic or layout parameter values using low level open access or similar VLSI database API's, and may create a large number of new design schematics or layouts in the library to create data pipelines for parallel scheduling and running.

In example 9, the subject matter of any one of examples 1 to 8 may include that the inverse machine learning model is configured to invoke and run simulation without updating feedforward machine learning model and that a control logic is configured to update feedforward machine learning model based on several statistical criterion. In this example, a control logic may thus be implemented to selectively update feed forward machine learning model based on statistical confidence from running multiple EDA simulations (or optimizations) in an iterative loop and selecting the best response to update the feedforward machine learning model.

In example 10, the subject matter of any one of examples 1 to 9 may include that the inverse machine learning model is configured to use statistical correlation and covariance from the feedforward machine learning model to make weight adjustments.

While embodiments of the invention have been particularly shown and described with reference to specific embodiments, it should be understood by those skilled in the art that various changes in form and detail may be made therein without departing from the scope of the invention as defined by the appended claims. The scope of the invention is thus indicated by the appended claims and all changes which come within the meaning and range of equivalency of the claims are therefore intended to be embraced.

What is claimed is:

1. A method of predicting performance in electronic design based on machine learning using at least one processor, the method comprising:
   providing a first machine learning model configured to predict performance data for an electronic system based on a set of input design parameters for the electronic system;
   providing a second machine learning model configured to generate a new set of parameter values for the set of input design parameters for the electronic system based on a desired performance data provided for the electronic system;
   generating, using the second machine learning model, the new set of parameter values for the set of input design parameters for the electronic system based on the desired performance data provided for the electronic system;
   evaluating the set of input design parameters having the new set of parameter values for the electronic system to obtain an evaluated performance data associated with the set of input design parameters having the new set of parameter values;
   generating a new set of training data based on the set of input design parameters having the new set of parameter values and the evaluated performance data associated with the set of input design parameters having the new set of parameter values; and
   training the first machine learning model based on at least the new set of training data.

2. The method according to claim 1, wherein said providing the first machine learning model comprises training the first machine learning model based on an initial set of training data for the electronic system.

3. The method according to claim 1, wherein said providing the second machine learning model comprises generating the second machine learning model based on the first machine learning model.

4. The method according to claim 1, wherein said evaluating the set of input design parameters having the new set of parameter values comprises evaluating the set of input design parameters having the new set of parameter values using an electronic design automation tool.

5. The method according to claim 1, wherein said generating the new set of training data comprises labeling the set of input design parameters having the new set of parameter values based on the evaluated performance data to obtain a new set of labeled data, the new set of training data comprising the new set of labeled data.

6. The method according to claim 1,
   wherein the first machine learning model is trained iteratively in a plurality of iterations, comprising a first iteration and one or more subsequent iterations,
   wherein the first iteration comprises:
      said providing the second machine learning model;
      said generating the new set of parameter values for the set of input design parameters;
      said evaluating the set of input design parameters having the new set of parameter values;
      said generating the new set of training data; and
      said training the first machine learning model based on at least the new set of training data,
   wherein in each of the one or more subsequent iterations, the subsequent iteration comprises:
      updating the second machine learning model based on the first machine learning model trained in the immediately previous iteration to obtain an updated second machine learning model;
      generating, using the updated second machine learning model, a further new set of parameter values for the set of input design parameters for the electronic system based on the desired performance data provided for the electronic system;
      evaluating the set of input design parameters having the further new set of parameter values for the electronic system to obtain a further evaluated performance data associated with the set of input design parameters having the further new set of parameter values;
      generating a further new set of training data based on the set of input design parameters having the further new set of parameter values and the further evaluated performance data associated with the set of input design parameters having the further new set of parameter values; and
      training the first machine learning model based on at least the further new set of training data.

7. The method according to claim 6, wherein the first machine learning model is trained iteratively and continues from a current iteration to a subsequent iteration of the plurality of iteration until the further new set of parameter values for the set of input design parameters obtained in the current iteration is evaluated to satisfy the desired performance data.

8. The method according to claim 1, wherein the first machine learning model is a forward machine learning model and the second machine learning model is an inverse machine learning model.

9. The method according to claim 1, wherein the performance data and the desired performance data each comprises a set of performance parameters.

10. The method according to claim 1, wherein the electronic system comprises at least one of an integrated circuit and a printed circuit board.

11. A system for predicting performance in electronic design based on machine learning, the system comprising:
   a memory; and
   at least one processor communicatively coupled to the memory and configured to:
   provide a first machine learning model configured to predict performance data for an electronic system based on a set of input design parameters for the electronic system;
   provide a second machine learning model configured to generate a new set of parameter values for the set of input design parameters for the electronic system based on a desired performance data provided for the electronic system;
   generate, using the second machine learning model, the new set of parameter values for the set of input design parameters for the electronic system based on the desired performance data provided for the electronic system;
    evaluate the set of input design parameters having the new set of parameter values for the electronic system to obtain an evaluated performance data associated with the set of input design parameters having the new set of parameter values;
    generate a new set of training data based on the set of input design parameters having the new set of parameter values and the evaluated performance data associated with the set of input design parameters having the new set of parameter values; and
    train the first machine learning model based on at least the new set of training data.

12. The system according to claim 11, wherein said provide the first machine learning model comprises training the first machine learning model based on an initial set of training data for the electronic system.

13. The system according to claim 11, wherein said provide the second machine learning model comprises generating the second machine learning model based on the first machine learning model.

14. The system according to claim 11, wherein said evaluate the set of input design parameters having the new set of parameter values comprises evaluating the set of input design parameters having the new set of parameter values using an electronic design automation tool.

15. The system according to claim 11, wherein said generate the new set of training data comprises labeling the set of input design parameters having the new set of parameter values based on the evaluated performance data to obtain a new set of labeled data, the new set of training data comprising the new set of labeled data.

16. The system according to claim 11,
    wherein the first machine learning model is trained iteratively in a plurality of iterations, comprising a first iteration and one or more subsequent iterations,
    wherein the first iteration comprises:
        said providing the second machine learning model;
        said generating the new set of parameter values for the set of input design parameters;
        said evaluating the set of input design parameters having the new set of parameter values;
        said generating the new set of training data; and
        said training the first machine learning model based on at least the new set of training data,
    wherein in each of the one or more subsequent iterations, the subsequent iteration comprises:
        updating the second machine learning model based on the first machine learning model trained in the immediately previous iteration to obtain an updated second machine learning model;
        generating, using the updated second machine learning model, a further new set of parameter values for the set of input design parameters for the electronic system based on the desired performance data provided for the electronic system;
        evaluating the set of input design parameters having the further new set of parameter values for the electronic system to obtain a further evaluated performance data associated with the set of input design parameters having the further new set of parameter values;
        generating a further new set of training data based on the set of input design parameters having the further new set of parameter values and the further evaluated performance data associated with the set of input design parameters having the further new set of parameter values; and
        training the first machine learning model based on at least the further new set of training data.

17. The system according to claim 16, wherein the first machine learning model is trained iteratively and continues from a current iteration to a subsequent iteration of the plurality of iteration until the further new set of parameter values for the set of input design parameters obtained in the current iteration is evaluated to satisfy the desired performance data.

18. The system according to claim 11, wherein the first machine learning model is a forward machine learning model and the second machine learning model is an inverse machine learning model.

19. The system according to claim 11, wherein the electronic system comprises at least one of an integrated circuit and a printed circuit board.

20. A computer program product, embodied in one or more non-transitory computer-readable storage mediums, comprising instructions executable by at least one processor to perform a method of predicting performance in electronic design based on machine learning, the method comprising:
    providing a first machine learning model configured to predict performance data for an electronic system based on a set of input design parameters for the electronic system;
    providing a second machine learning model configured to generate a new set of parameter values for the set of input design parameters for the electronic system based on a desired performance data provided for the electronic system;
    generating, using the second machine learning model, the new set of parameter values for the set of input design parameters for the electronic system based on the desired performance data provided for the electronic system;
    evaluating the set of input design parameters having the new set of parameter values for the electronic system to obtain an evaluated performance data associated with the set of input design parameters having the new set of parameter values;
    generating a new set of training data based on the set of input design parameters having the new set of parameter values and the evaluated performance data associated with the new set of input design parameters having the new set of parameter values; and
    training the first machine learning model based on at least the new set of training data.

\* \* \* \* \*